US009768808B2

(12) United States Patent
Sprouse et al.

(10) Patent No.: US 9,768,808 B2
(45) Date of Patent: *Sep. 19, 2017

(54) METHOD FOR MODIFYING DEVICE-SPECIFIC VARIABLE ERROR CORRECTION SETTINGS

(71) Applicant: SanDisk Technologies LLC, Plano, TX (US)

(72) Inventors: Steven T. Sprouse, San Jose, CA (US); Aaron K. Olbrich, Morgan Hill, CA (US); James Fitzpatrick, Sudbury, MA (US); Neil R. Darragh, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/885,883

(22) Filed: Oct. 16, 2015

(65) Prior Publication Data

US 2016/0301427 A1 Oct. 13, 2016

Related U.S. Application Data

(60) Provisional application No. 62/144,844, filed on Apr. 8, 2015.

(51) Int. Cl.
*G11C 29/00* (2006.01)
*H03M 13/35* (2006.01)
(Continued)

(52) U.S. Cl.
CPC ....... *H03M 13/353* (2013.01); *G06F 11/1048* (2013.01); *G11C 29/028* (2013.01);
(Continued)

(58) Field of Classification Search
None
See application file for complete search history.

(56) References Cited

U.S. PATENT DOCUMENTS 5,361,227 A 11/1994 Tanaka et al.
5,758,050 A 5/1998 Brady et al.
(Continued)

FOREIGN PATENT DOCUMENTS

EP 2447842 A1 5/2012
WO WO 2007/036834 4/2007
(Continued)

OTHER PUBLICATIONS

International Search Report and Written Opinion dated May 23, 2013, received in International Patent Application No. PCT/US2012/065914, which corresponds to U.S. Appl. No. 13/679,963, 7 pgs (Frayer).

(Continued)

*Primary Examiner* — M. Mujtaba Chaudry
(74) *Attorney, Agent, or Firm* — Brinks Gilson & Lione

(57) ABSTRACT

The various implementations described herein include systems, methods and/or devices for modifying an error correction format of a respective memory portion of non-volatile memory in a storage device. In one aspect, the method includes, for respective memory portions of the non-volatile memory, obtaining a performance metric of the respective memory portion, and modifying a current error correction format in accordance with the measured performance metric, the current error correction format corresponding to a code rate, codeword structure, and error correction type. Furthermore, data is stored, and errors are detected and corrected, in the respective memory portion in accordance with the modified error correction format. The current and modified error correction formats are distinct, and comprise two of a sequence of predefined error correc- (Continued)

tion formats, wherein a plurality of the sequence of predefined error correction formats have a same number of error correction bits and different numbers of data bits.

28 Claims, 16 Drawing Sheets

(51) Int. Cl.
G11C 29/52 (2006.01)
H03M 13/00 (2006.01)
G06F 11/10 (2006.01)
G11C 29/02 (2006.01)
G11C 29/04 (2006.01)

(52) U.S. Cl.
CPC ......... *G11C 29/52* (2013.01); *H03M 13/6356* (2013.01); *H03M 13/6362* (2013.01); *H03M 13/6513* (2013.01); *G11C 2029/0411* (2013.01)

(56) References Cited

U.S. PATENT DOCUMENTS

| | | | |
|---|---|---|---|
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,487,685 B1 | 11/2002 | Stuart Fiske et al. | |
| 6,516,437 B1 | 2/2003 | Van Stralen et al. | |
| 6,961,890 B2 | 11/2005 | Smith | |
| 7,559,004 B1 * | 7/2009 | Chang | H03M 13/11 714/708 |
| 7,685,494 B1 | 3/2010 | Varnica et al. | |
| 7,954,041 B2 | 5/2011 | Hong et al. | |
| 7,958,433 B1 | 6/2011 | Yoon et al. | |
| 7,974,368 B2 | 7/2011 | Shieh et al. | |
| 8,006,161 B2 | 8/2011 | Lestable et al. | |
| 8,069,390 B2 | 11/2011 | Lin | |
| 8,190,967 B2 | 5/2012 | Hong et al. | |
| 8,397,141 B2 | 3/2013 | Lapstun | |
| 8,949,690 B2 | 2/2015 | Sugahara et al. | |
| 9,559,725 B1 | 1/2017 | Shao et al. | |
| 2004/0146006 A1 | 7/2004 | Jackson | |
| 2005/0094459 A1 | 5/2005 | Sesek et al. | |
| 2005/0172207 A1 | 8/2005 | Radke et al. | |
| 2007/0157064 A1 | 7/2007 | Falik et al. | |
| 2008/0086677 A1 | 4/2008 | Yang et al. | |
| 2008/0168319 A1 | 7/2008 | Lee et al. | |
| 2008/0195900 A1 | 8/2008 | Chang et al. | |
| 2009/0144598 A1 | 6/2009 | Yoon et al. | |
| 2009/0222708 A1 | 9/2009 | Yamaga | |
| 2011/0202818 A1 * | 8/2011 | Yoon | G06F 11/1068 714/773 |
| 2012/0079229 A1 | 3/2012 | Jensen et al. | |
| 2012/0192035 A1 * | 7/2012 | Nakanishi | G06F 11/1048 714/766 |
| 2012/0290899 A1 * | 11/2012 | Cideciyan | G06F 11/1072 714/773 |
| 2012/0317463 A1 | 12/2012 | Sugahara et al. | |
| 2013/0346671 A1 | 12/2013 | Michael et al. | |
| 2014/0136927 A1 | 5/2014 | Li et al. | |
| 2014/0229799 A1 * | 8/2014 | Hubris | H04L 1/0009 714/773 |
| 2014/0258805 A1 | 9/2014 | Casado et al. | |
| 2015/0143185 A1 | 5/2015 | Motwani | |
| 2015/0222291 A1 | 8/2015 | Kokubun et al. | |

FOREIGN PATENT DOCUMENTS

| | | |
|---|---|---|
| WO | WO 2009/028281 | 3/2009 |
| WO | WO 2009/032945 | 3/2009 |

OTHER PUBLICATIONS

Office Action dated Nov. 4, 2015 received in European Patent Application No. 12808940.6, which corresponds to U.S. Appl. No. 13/679,963, 4 pages (Frayer).
International Search Report and Written Opinion dated Apr. 5, 2013, received in International Patent Application No. PCT/US2012/065916, which corresponds to U.S. Appl. No. 13/679,969, 7 pgs (Frayer).
Office Action dated Nov. 3, 2015 received in European Patent Application No. 12806217.1, which corresponds to U.S. Appl. No. 13/679,969, 4 pages (Frayer).
Office Action dated Nov. 2, 2015 received in European Patent Application No. 12805828.6, which corresponds to U.S. Appl. No. 13/679,970, 5 pages (Frayer).
International Search Report and Written Opinion dated Jun. 17, 2013, received in International Patent Application No. PCT/US2012/065919, which corresponds to U.S. Appl. No. 13/679,970, 8 pgs (Frayer).
International Search Report and Written Opinion dated Sep. 30, 2016, received in International Patent Application No. PCT/US2016/026052, which corresponds to U.S. Appl. No. 14/929,148, 18 pages (Olbrich).
Office Action for co-pending U.S. Appl. No. 14/929,148, dated May 11, 2017, 16 pgs.

\* cited by examiner

Format Descriptor 400

| Format # | 1 | 2 | 3 | 4 | 5 | 6 | 7 | 8 |
|---|---|---|---|---|---|---|---|---|
| Parity | 3% | 4% | 5% | 6% | 6% | 7% | 8% | 9% |
| CW Structure | 4 KB | 3.5 KB | 3 KB | 4KB | 4 KB | 4 KB | 4 KB | 4 KB |
| ECC Type | BCH | BCH | BCH | BCH | LDPC | LDPC | LDPC | LDPC |

Figure 4A

Format Table 410

| | Die 1 | Die 2 | Die 3 | Die 4 | Die 5 | Die 6 | Format # |
|---|---|---|---|---|---|---|---|
| CS1 | 4 | 4 | 4 | 4 | 4 | 4 | 4-4-4-4-4-4 |
| CS2 | 3 | 1 | 1 | 1 | 1 | 1 | 3-1-1-1-1-1 |
| CS3 | 1 | 1 | 1 | 1 | 1 | 1 | 1-1-1-1-1-1 |
| CS4 | 1 | 1 | 1 | 4 | 1 | 4 | 1-1-1-4-1-4 |

Figure 4B

702 — For each respective memory portion of the plurality of memory portions of the NVM, in accordance with an error correction format of the respective memory portion:

712 — Each memory portion of the plurality of memory portions of the NVM has a corresponding error correction format (A)

724 — The error correction format of two or more memory portions of the plurality of memory portions is a base error correction format selected in accordance with physical characteristics of the two or more memory portions

726 — The physical characteristics include a physical location of the respective memory portion, wherein the physical location corresponds to either an upper page or a lower page of a multi-level cell (B)

728 — Store, in a table, the corresponding error correction format index values of two or more memory portions of the plurality of memory portions of the NVM For a respective memory portion of the plurality of memory portions of the NVM:

730 — Obtain a performance metric of the respective memory portion

732 — Modify the error correction format of the respective memory portion in accordance with the obtained performance metric

734 — Record, in the table, an error correction format index value corresponding to the modified error correction format (C)

Figure 7B

For each respective memory portion of the plurality of memory portions of the NVM, in accordance with an error correction format of the respective memory portion: ~702

(C)

The plurality of distinct memory portions of non-volatile memory (NVM) in the storage device include a plurality of distinct memory portions of non-volatile memory (NVM) in each of a plurality of non-volatile memory die ~736

Store, in one or more tables: ~738

A base correction format index value for each non-volatile memory die of the plurality of non-volatile memory die, the base correction format index value for a respective non-volatile memory die indicating a default error correction format for memory portions in the non-volatile memory die ~740

A plurality of exception values, each exception value indicating, for a corresponding memory portion of particular non-volatile memory die of the plurality of non-volatile memory die, an error correction format distinct from the default error correction format for memory portions in the particular non-volatile memory die ~742

Figure 7C

METHOD FOR MODIFYING DEVICE-SPECIFIC VARIABLE ERROR CORRECTION SETTINGS

RELATED APPLICATIONS

This application claims priority to U.S. Provisional Patent Application No. 62/144,844, filed Apr. 8, 2015, which is hereby incorporated by reference in its entirety.

This application is related to U.S. Provisional Patent Application No. 62/144,839, "Device-Specific Variable Error Correction," filed on Apr. 8, 2015, and US Provisional Patent Application No. 62/144,847, "Mapping Logical Groups of Data to Physical Locations in Memory," filed on Apr. 8, 2015, both of which are hereby incorporated by reference in their entireties.

TECHNICAL FIELD

The disclosed embodiments relate generally to memory systems, and in particular, to encoding and decoding data, modifying error correction parameters, and performing sequential read and write memory operations.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

Error correction schemes have been used to limit the increased likelihood of errors in memory systems. However, error correction schemes, particularly those with high error correction capability, are often resource intensive and not configured for optimal system performance.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable: (i) encoding and decoding data in accordance with an error correction format of a respective memory portion of non-volatile memory, (ii) modifying an error correction format of a respective memory portion of non-volatile memory, and (iii) reading data stored in a non-volatile storage device having a plurality of physical memory portions having a predefined sequence of physical locations in one or more non-volatile memory.

In one aspect, encoding and decoding data to be stored in a memory portion of non-volatile memory is in accordance with a respective error correction format. In particular, the respective error correction format corresponds to a code rate, a codeword structure, and an error correction type. Furthermore, the respective error correction format comprises one of a sequence of three or more predefined error correction formats, wherein a plurality of the sequence of predefined error correction formats have a same number of error correction bits and different numbers of data bits.

In another aspect, a respective error correction format of a memory portion of non-volatile memory is modified. In particular, a performance metric of the respective memory portion is measured or otherwise obtained, and the respective error correction format is modified in accordance with the obtained performance metric of the respective memory portion, where the error correction format corresponds to a code rate, a codeword structure, and an error correction type. Furthermore, in accordance with the modified error correction format, data is stored in the respective memory portion, and errors are detected and corrected in the data stored in the respective memory portion.

In yet another aspect, data stored in a non-volatile storage device having a plurality of physical memory portions having a predefined sequence of physical locations in one or more non-volatile memory devices is read. In particular, a command for reading a requested logical group of data having a specified logical address is executed, which includes mapping the logical address to one or more physical locations in the storage device. In accordance with a determination that the one or more physical locations in the storage device correspond to two physical memory portions at sequential physical locations in the predefined sequence of physical locations, a single sequential read operation is used to read data from the two physical memory portions, after which the requested logical group of data is returned.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 4A-4B illustrates various tables for defining and storing error correction format information, in accordance with some embodiments.

FIGS. 7A-7C illustrate a flowchart representation of a method of encoding and decoding data for a plurality of memory portions of a non-volatile memory device, in accordance with some embodiments.

Figure 1:
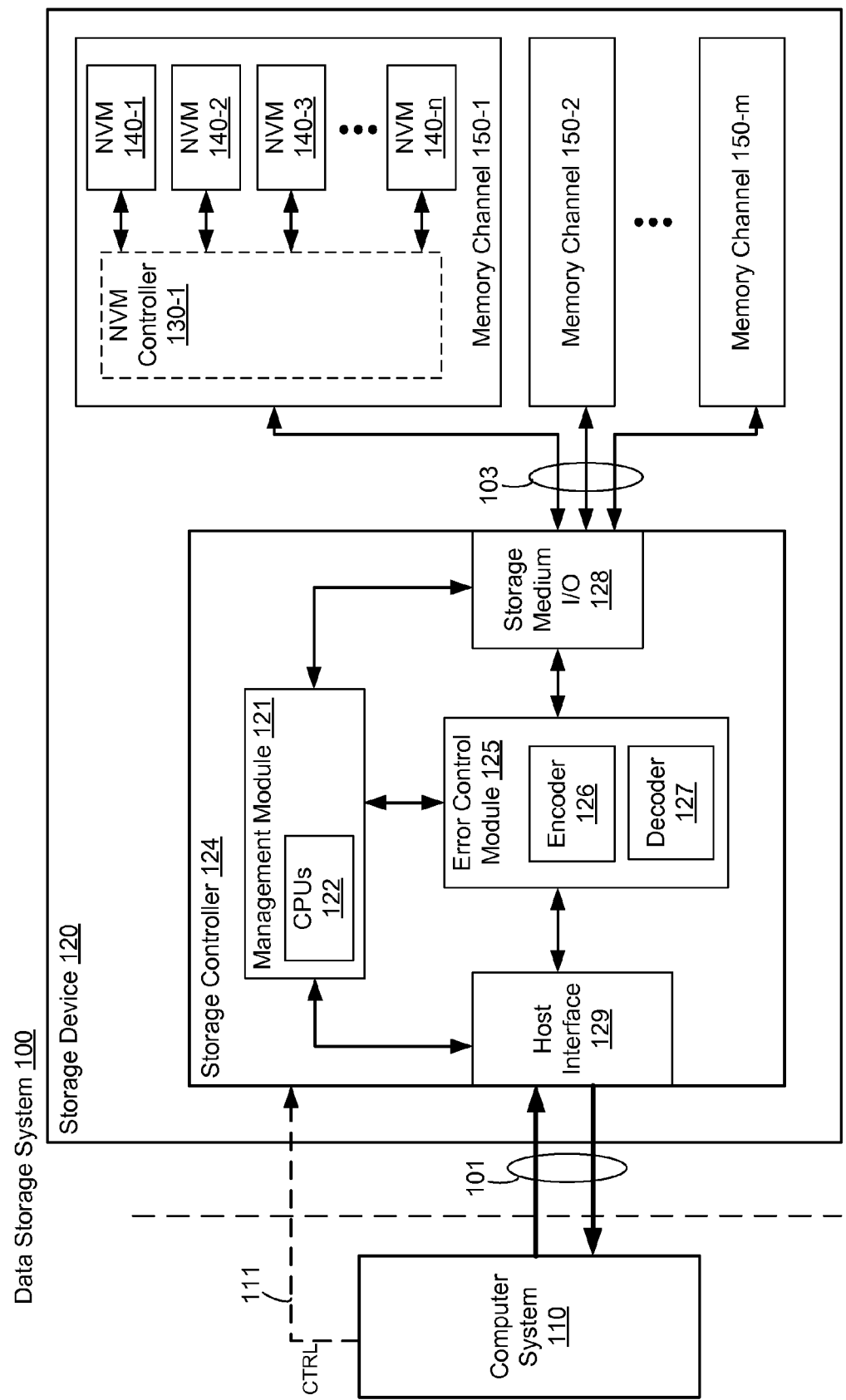
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable: (i) encoding and decoding data in accordance with an error correction format of a respective memory portion of non-volatile memory, (ii) modifying an error correction format of a respective memory portion of non-volatile memory, and (iii) reading data stored in a non-volatile storage device having a plurality of physical memory portions having a predefined sequence of physical locations in one or more non-volatile memory.

(A1) More specifically, some implementations include a method of encoding and decoding data for a plurality of memory portions of a non-volatile memory device. In some implementations, the method includes, for each respective memory portion of the plurality of distinct memory portions of the NVM, in accordance with an error correction format of the respective memory portion: encoding data to produce one or more codewords; storing the one or more codewords in the respective memory portion; and decoding the one or more codewords to produce decoded data corresponding to the encoded data one or more codewords, which includes detecting and correcting errors in the decoded data. Each memory portion of the plurality of memory portions of the NVM has a corresponding error correction format, the error correction format corresponding to a code rate, a codeword structure, and an error correction type. Furthermore, the error correction format comprises one of a sequence of three or more predefined error correction formats, wherein a plurality of the sequence of predefined error correction formats have a same number of error correction bits and different numbers of data bits. Moreover, at least two memory portions of the plurality of memory portions of the NVM have distinct error correction formats.

(A2) In some embodiments of the method of A1, each error correction format in the sequence of predefined error correction formats has a corresponding error correction format index value in a sequence of error correction format index values.

(A3) In some embodiments of the method of A2, the method includes storing, in a table, the corresponding error correction format index values of two or more memory portions of the plurality of memory portions of the NVM.

(A4) In some embodiments of the method of A3, the method includes, for a respective memory portion of the plurality of memory portions of the NVM: obtaining a performance metric of the respective memory portion; modifying the error correction format of the respective memory portion in accordance with the obtained performance metric; and recording, in the table, an error correction format index value corresponding to the modified error correction format.

(A5) In some embodiments of the method of any of A1-A4, the plurality of distinct memory portions of non-volatile memory (NVM) in the storage device includes a plurality of distinct memory portions of non-volatile memory (NVM) in each of a plurality of non-volatile memory die. The method includes storing, in one or more tables, a base correction format index value for each non-volatile memory die of the plurality of non-volatile memory die, the base correction format index value for a respective non-volatile memory die indicating a default error correction format for memory portions in the non-volatile memory die. Furthermore, the method includes storing, in one or more tables, a plurality of exception values, each exception value indicating, for a corresponding memory portion of a particular non-volatile memory die of the plurality of non-volatile memory die, an error correction format distinct from the default error correction format for memory portions in the particular non-volatile memory die.

(A6) In some embodiments of the method of any of A1-A5, each predefined error correction format in the sequence of predefined error correction formats corresponds to a distinct combination of code rate and error correction type.

(A7) In some embodiments of the method of any of A1-A6, the error correction format of two or more memory portions of the plurality of memory portions is a base error correction format selected in accordance with physical characteristics of the two or more memory portions.

(A8) In some embodiments of the method of A7, the physical characteristics include a physical location of the respective memory portion, wherein the physical location corresponds to either an upper page or a lower page of a multi-level cell.

(A9) In some embodiments of the method of any of A1-A8, the distinct memory portions are distinct memory erase blocks, word lines or pages of the NVM.

(A10) In another aspect, any of the methods A1-A9 described above are performed by a data storage device or system comprising non-volatile memory (NVM) having a plurality of distinct memory portions, wherein each memory portion of at least a subset of the plurality of memory portions of the NVM has a corresponding error correction format. Furthermore, the error correction format corresponds to a code rate, a codeword structure, and an error correction type, and the error correction format comprises one of a sequence of three or more predefined error correction formats, wherein a plurality of the sequence of predefined error correction formats have a same number of error correction bits and different numbers of data bits. Each error correction format in the sequence of predefined error correction formats has a corresponding error correction format index value in a sequence of error correction format index values, and at least two memory portions of at least the subset of the memory portions have distinct error correction formats. The storage device or system further includes an encoder to produce, in accordance with an error correction format of a respective memory portion, one or more codewords from data for storage in the respective memory portion, and a decoder to produce, in accordance with an error correction format of a respective memory portion, decoded data from one or more codewords, and to detect and correct errors in the decoded data.

(A11) In yet another aspect, a non-transitory computer readable storage medium stores one or more programs for execution by one or more processors, the one or more programs including instructions for performing the method of any of A1 to A8.

(B1) Some implementations include a method of modifying an error correction format of a respective memory portion of non-volatile memory (NVM) in a storage device. In some implementations, the method includes, for each respective memory portion of a plurality of distinct memory portions of the NVM: obtaining a performance metric of the respective memory portion; and modifying a current error correction format of the respective memory portion in accordance with the obtained performance metric, wherein the current error correction format corresponds to a code rate, a codeword structure, and an error correction type. Furthermore, the method includes, for each respective memory portion of a plurality of distinct memory portions of the NVM: storing data in the respective memory portion in accordance with the modified error correction format; and detecting and correcting errors in the data stored in the respective memory portion in accordance with the modified error correction format of the respective memory portion. The modified error correction format is distinct from the current error correction format, and the modified error correction format and the current error correction format comprise two of a sequence of three or more predefined error correction formats, wherein a plurality of the sequence of predefined error correction formats have a same number of error correction bits and different numbers of data bits.

(B2) In some embodiments of the method of B1, modifying the current error correction format of the respective memory portion includes modifying at least one of the code rate and the error correction type corresponding to the current error correction format.

(B3) In some embodiments of the method of B1, modifying the current error correction format of the respective memory portion includes modifying at least one of the codeword structure and the error correction type corresponding to the current error correction format.

(B4) In some embodiments of the method of any of B1-B3, each predefined error correction format in the sequence of predefined error correction formats corresponds to a distinct combination of code rate and error correction type.

(B5) In some embodiments of the method of any of B3-B4, each error correction format in the sequence of predefined error correction formats has a corresponding error correction format index value in a sequence of error correction format index values. Furthermore, modifying the current error correction format of the respective memory portion includes: decreasing an error correction format index for the respective memory portion to an index value for an error correction format preceding the current error correction format in the sequence of predefined error correction formats; or increasing the error correction format index for the respective memory portion to an index value for an error correction format succeeding the current error correction format in the sequence of predefined error correction formats.

(B6) In some embodiments of the method of B5, decreasing the error correction format index is in accordance with a determination that the performance metric of the respective memory portion satisfies (e.g., is less than) a first threshold performance metric, and increasing the error correction format index is in accordance with a determination that the performance metric of the respective memory portion satisfies (e.g., is greater than) a second threshold performance metric, wherein the second threshold performance metric is greater than the first threshold performance metric.

(B7) In some embodiments of the method of B6, the method includes, in accordance with a determination that the performance metric of the respective memory portion satisfies (e.g., is greater than) a third threshold performance metric, detecting and correcting errors in data stored in the respective memory portion using soft information, wherein the third threshold performance metric is greater than the second threshold performance metric.

(B8) In some embodiments of the method of any of B1-B7, the current error correction format of the respective memory portion is a base error correction format selected in accordance with physical characteristics of the respective memory portion.

(B9) In some embodiments of the method of B8, the physical characteristics include a physical location of the respective memory portion, wherein the physical location corresponds to either an upper page or a lower page of a multi-level cell.

(B10) Furthermore, in some embodiments of the method of any of B1-B9, the method includes modifying the current error correction format of the respective memory portion in accordance with a change in the physical characteristics of the respective memory portion.

(B11) In some embodiments of the method of any of B1-B10, modifying the current error correction format of the respective memory portion includes recording, in an exception table in the storage device, a value corresponding to the modified error correction format.

(B12) In some embodiments of the method of any of B1-B11, modifying the current error correction format is performed in accordance with detection of a predefined trigger condition.

(B13) In some embodiments of the method of any of B1-B12, the distinct memory portions are distinct memory erase blocks, word lines or pages of the NVM device.

(B14) In some embodiments, the performance metric is a bit error rate (BER).

(B15) In another aspect, any of the methods B1-B14 are performed by a storage device or system that includes non-volatile memory (NVM) having a plurality of distinct memory portions in a plurality of non-volatile memory (NVM) devices, and one or more memory controllers, the one or more memory controllers including one or more processors and memory for storing one or more programs for execution by the one or more processors, the one or more programs including instructions for performing the method of any of B1-B14.

(B16) In some embodiments of the storage device or system of B15, the storage device or system includes a performance metric module configured to obtain a performance metric of a respective memory portion in the plurality of NVM devices; an ECC adjustment module configured to modify a current error correction format of the respective memory portion in accordance with the obtained performance metric, and record, in a table in the storage device or system, an error correction format index value corresponding to the modified error correction format.

(B17) In some embodiments of the storage device or system of B15, the storage device or system includes a performance metric module configured to obtain a performance metric of a respective memory portion in the plurality of NVM devices, an ECC adjustment module configured to modify a current error correction format of the respective memory portion in accordance with the obtained performance metric, and a memory operation module configured to store data in the respective memory portion, and to detect and correct errors in the data stored in the respective memory portion.

(B16) In yet another aspect, a non-transitory computer readable storage medium stores one or more programs for execution by one or more processors (e.g., in one or more storage controllers of a storage device or system), the one or more programs including instructions for performing the method of any of B1 to B14.

(C1) Some implementations include a method of reading data stored in a non-volatile storage device having a plurality of physical memory portions having a predefined sequence of physical locations in one or more non-volatile memory devices of the storage device. In some implementations, the method includes, executing a command for reading a requested logical group of data having a specified logical address, including mapping the logical address to one or more physical locations in the storage device. Furthermore, in accordance with a first determination that the one or more physical locations in the storage device correspond to a single physical memory portion, data is read from the single physical memory portion, which includes the requested logical group of data, and the requested logical group of data is returned. In accordance with a second determination that the one or more physical locations in the storage device correspond to two physical memory portions at sequential physical locations in the predefined sequence of physical locations, a single sequential read operation is used to read data from the two physical memory portions, which together include the requested logical group of data, and the requested logical group of data is returned. In accordance with a third determination that the one or more physical locations in the storage device correspond to two physical memory portions at non-sequential physical locations in the predefined sequence of physical locations, two read operations are used to read data from the two non-sequential physical memory portions, which together include the requested logical group of data, and the requested logical group of data is returned.

(C2) In some embodiments of the method of C1, in accordance with the second determination, the single sequential read operation to read data from the two physical memory portions reads data from a single word line of a respective NVM device of the storage device.

(C3) In some embodiments of the method of C1 or C2, in accordance with the third determination, the two read operations to read data from the two non-sequential physical memory portions read data from two distinct word lines in one or two NVM devices of the storage device.

(C4) In some embodiments of the method of any of C1-C3, in accordance with the first determination, reading data from the single physical memory portion includes reading data from a plurality of codewords.

(C5) Furthermore, in some embodiments of the method of C4, the plurality of codewords includes data for at least one logical group of data other than the requested logical group of data.

(C6) In some embodiments of the method of any of C1 to C5, the physical memory portions are physical pages of the NVM device, and the requested logical group of data comprises a logical page of data.

(C7) In some embodiments of the method of any of C1 to C6, the sequential read operation reads data from a plurality of physical memory portions, wherein the plurality of physical memory portions store a plurality of logical groups of data.

(C8) In some embodiments of the method of any of C1 to C7, in accordance with the second determination, reading data from the two physical memory portions includes: reading data from a first plurality of codewords stored in one of the two physical memory portions; and reading data from a second plurality of codewords stored in the other of the two physical memory portions, wherein each codeword of the first plurality of codewords have a first codeword length, and each codeword of the second plurality of codewords have a second codeword length, distinct from the first codeword length.

(D1) Some implementations include a method of storing data in a non-volatile storage device having a plurality of physical memory portions, the physical memory portions having a predefined sequence of physical locations in one or more non-volatile memory devices of the storage device. In some implementations, the method includes executing a plurality of commands, each command of the plurality of commands for storing in the storage device a requested logical group of data having a specified logical address. Executing a plurality of commands includes, for each command of the plurality of commands, storing the data in one or more physical locations in the storage device. Furthermore, executing a plurality of commands includes, for each command of the plurality of commands, mapping the logical address of the logical group of data to the one or more physical locations in the storage device. Specifically, for a first command of the plurality of commands, the one or more physical locations in the storage device correspond to a single physical memory portion in the storage device. For a second command of the plurality of commands, the one or more physical locations in the storage device correspond to two physical memory portions at sequential physical locations in the predefined sequence of physical locations. Furthermore, for a third command of the plurality of commands, the one or more physical locations in the storage device comprise two physical memory portions at non-sequential physical locations in the predefined sequence of physical locations.

(D2) In some embodiments of the method of D1, for the first command, a first physical location of the one or more physical locations meets first criteria. Furthermore, for the second command, the first physical location of the one or more physical locations meets second criteria distinct from the first criteria. Moreover, for the third command, the first physical location of the one or more physical locations meets third criteria distinct from the first criteria and second criteria.

(D3) In some embodiments of the method of D1 or D2, the third criteria is met by a respective starting point physical location when the first and second criteria are not met.

(D4) In some embodiments of the method of any of D1 to D4, storing the data in the one or more physical locations in the storage device includes: encoding the data to produce one or more codewords, and storing the one or more codewords in the one or more physical locations in the storage device.

(D5) In some embodiments of the method of any of D1 to D4, the two physical memory portions at sequential physical locations in the predefined sequence of physical locations are physical memory portions of a single word line of a respective NVM device of the storage device.

(D6) In some embodiments of the method of any of D1 to D5, the two physical memory portions at non-sequential physical locations in the predefined sequence of physical locations are physical memory portions of two distinct word lines in one or two NVM devices of the storage device.

(D7) In another aspect, any of the methods C1 to C8 and D1 to D6 described above are performed by a storage device comprising: (1) one or more non-volatile memory devices; (2) a memory controller that includes a mapping module; and (3) an interface to receive a plurality of commands. Each command of the plurality of commands comprising a command to access one or more physical locations in the storage device in accordance with a specified logical address specified by the command. Furthermore, the mapping module is configured to map the specified logical address, specified by a respective command of the plurality of commands, to the one or more physical locations in the one or more non-volatile memory devices of the storage device, wherein: for a first command of the plurality of commands, the one or more physical locations in the storage device correspond to a single physical memory in the storage device; for a second command of the plurality of commands, the one or more physical locations in the storage device correspond to two physical memory portions at sequential physical locations in the predefined sequence of physical locations; and for a third command of the plurality of commands, the one or more physical locations in the storage device comprise two physical memory portions at non-sequential physical locations in the predefined sequence of physical locations.

(D8) In yet another aspect, a non-transitory computer readable storage medium stores one or more programs for execution by one or more processors, the one or more programs including instructions for performing the method of any of C1 to C8 and D1 to D6.

(E1) Some embodiments include an electronic system or device (e.g., data storage device 120, data storage system 100, or storage controller 124, FIG. 1), comprising: one or more processors; and memory storing one or more programs to be executed by the one or more processors, the one or more programs comprising instructions for performing or controlling performance of any of the methods described herein. Some embodiments include a non-transitory computer readable storage medium, storing one or more programs for execution by one or more processors of an electronic system or device (e.g., data storage device 120, FIG. 1 or storage controller 124, FIG. 1), the one or more programs including instructions for performing or controlling performance of any of the methods described herein. Some embodiments include an electronic system or device (e.g., data storage device 120, FIG. 1 or storage controller 124, FIG. 1) comprising means for performing or controlling performance of the operations of any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120, which includes a storage controller 124 and one or more memory channels 150 that each include one or more NVM devices 140 and optionally include a respective NVM controller 130, where data storage system 100 is used in conjunction with or includes a computer system 110. In some embodiments, NVM devices 140 for a single memory channel 150 comprise a single flash memory device while in other embodiments NVM devices 140 for a single memory channel 150 include a plurality of flash memory devices. In some embodiments, NVM devices 140 are NAND-type flash memory or NOR-type flash memory. In some embodiments, NVM devices 140 include one or more three-dimensional (3D) memory devices, as further defined herein. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 can contain one or more storage devices 120.

Computer system 110 is coupled to storage controller 124 through data connections 101, and optionally through a control bus or connection 111 as well. However, in some embodiments computer system 110 includes storage controller 124, or a portion of storage controller 124, as a component and/or a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch screen display, a mouse, a track-pad, a digital camera and/or any number of supplemental devices to add functionality. In some embodiments, computer system 110 does not have a display and other user interface components.

In some implementations, storage device 120 includes NVM devices 140 such as flash memory devices (e.g., NVM devices 140-1 through 140-n). The NVM devices of storage device 120 are sometimes collectively called a storage medium. In some embodiments storage device 120 includes NVM controllers (e.g., NVM controllers 130, sometimes called memory channel controllers or port controllers) coupled between storage controller 124 and NVM devices 140. Viewed another way, in the aforementioned embodiments, storage device 120 includes m memory channels (e.g., memory channels 150-1 through 150-m), each of which has an NVM controller 130 and a set of NVM devices 140 coupled to the NVM controller for that memory channel, where m is an integer greater than one. However, in some embodiments, two or more memory channels share an NVM controller. Typically, each memory channel 150 has its own distinct set of one or more NVM devices 140. Alternatively, in some embodiments, storage device 120 does not include any NVM controllers 130, and instead storage controller 124 handles functions such as host command parsing and logical to physical address translation, and also manages the NVM devices 140 in all the memory channels 150-1 to 150-m, including distributing individual memory operations (e.g. read, write, and erase) commands to the NVM devices 140 in the various memory channels. In a non-limiting example, the number of memory channels in a typical storage device is 8, 16 or 32. In another non-limiting example, the number of NVM devices 140 per memory channel is typically 8, 16, 32 or 64. Furthermore, in some implementations, the number of NVM devices 140 is different in different memory channels.

Memory channels 150 are coupled to storage controller 124 through connections 103. Connections 103 are sometimes called data connections, but typically convey commands in addition to data, and optionally convey metadata, error correction information and/or other information in addition to data values to be stored in NVM devices 140 and data values read from NVM devices 140. In some embodiments, however, storage controller 124 and NVM devices 140 are included in the same device (i.e., an integral device) as components thereof. Furthermore, in some embodiments, storage controller 124 and NVM devices 140 are embedded in a host device (e.g., computer system 110), such as a mobile device, tablet, other computer or computer controlled device, and the methods described herein are performed, at least in part, by the embedded memory controller.

Flash memory device(s) (e.g., NVM devices 140) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

NVM devices 140 are divided into a number of addressable and individually selectable blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. The number of pages included in each block varies from one implementation to another; examples are 64, 128 and 256 pages, but other numbers of pages per block are suitable in some implementations.

As noted above, while data storage densities of non-volatile semiconductor memory devices are generally increasing, a drawback of increasing storage density is that the stored data is more prone to being stored and/or read erroneously. In some embodiments, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 124 includes a management module 121, a host interface 129, a storage medium I/O interface 128, and error control module 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to memory channels 150 and respective NVM devices 140 though connections 103. In some embodiments, storage medium I/O 128 includes transmit and receive circuitry, including circuitry capable of providing reading signals to NVM controllers 130 (e.g., reading threshold voltages for NAND-type flash memory).

In some embodiments, management module 121 includes one or more processing units (CPUs, also sometimes called processors) 122 configured to execute instructions in one or more programs (e.g., in management module 121). In some embodiments, the one or more CPUs 122 are shared by one or more components within, and in some cases, beyond the function of storage controller 124. Management module 121 is coupled to host interface 129, error control module 125 and storage medium I/O 128 in order to coordinate the operation of these components. In some embodiments, one or more modules of management module 121 are implemented in a management module of computer system 110 (not shown). In some embodiments, one or more processors of computer system 110 (not shown) are configured to execute instructions in one or more programs (e.g., in a management module of computer system 110).

Error control module 125 is coupled to storage medium I/O 128, host interface 129, and management module 121. As an example, error control module 125 is used to limit the number of uncorrectable errors inadvertently introduced into data during writes to memory or reads from memory. In some embodiments, error control module 125 is executed in software by the one or more CPUs 122 of management module 121, and, in other embodiments, error control module 125 is implemented in whole or in part using special purpose circuitry (e.g., to perform encoding and decoding functions). In some embodiments, error control module 125 is implemented in whole or in part by software executed on computer system 110.

In some embodiments, error control module 125 includes encoder 126 and decoder 127. In some embodiments, encoder 126 encodes data by applying an error control code to produce a codeword, which is subsequently stored in one or more NVM devices 140 of one or more memory channels 150. Codewords produced by the encoder include both data (sometimes herein called the encoded data) and corresponding error correction bits (sometimes called parity values, parity bits, or syndrome values). Furthermore, as described in greater detail below, encoders can be configured to produce codewords having a particular code rate (e.g., ratio of data bits in a codeword to the size of the codeword) and codeword structure (e.g., length, in bits, of the codeword; optionally, the codeword structure also includes information about where, within the codeword, the error correction bits are located). When the encoded data (e.g., one or more codewords) is read from NVM devices 140, the decoder applies a decoding process to the encoded data to recover the data, and to correct errors in the recovered data within the error correcting capability of the error control code.

Types of error correction codes include, for example, Hamming, Reed-Solomon (RS), Bose Chaudhuri Hocquenghem (BCH), and low-density parity-check (LDPC). Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type, class, or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, encoder 126 includes a plurality of encoders configured to encode data in accordance with one or more error correction formats (e.g., corresponding to a particular code rate, codeword structure, and error correction type, as described in greater detail below), and decoder 127 includes a plurality of decoders configured to decode data in accordance with one or more error correction formats. Furthermore, in some implementations, each of the plurality of encoders and/or decoders are configured to encode/decode data in accordance with distinct error correction formats (e.g., encoder 126 includes a BCH encoder and an LDPC encoder).

Error control module 125 optionally includes a soft information generation module (not shown) that is configured to provide soft information to one or more decoders of decoder 127. Typically, a soft information generation module converts the decoding result of a decoder into soft information. In some implementation, the soft information includes at least one of conditional probabilities (i.e., transition probabilities) associated with the codeword and log-likelihood ratios (LLRs) associated with the codeword.

As would be known to those skilled in the art, for many error control codes, the decoding process can often be improved by using soft information. Hard information decoding generally means that absolute decisions are made as to whether a data value (e.g., data-bit or code-bit) is one symbol or another in a particular symbol alphabet. For example, in a binary system, a particular data value can be either "0" or "1", even if the raw electrical analog value read from a storage location does not indicate that the electrical value representing the data value is sufficient to decide with certainty that the data value is "0" or "1." In other words, a hard-decision for a particular data value is based on the most likely symbol corresponding to the analog electrical value read from the non-volatile memory devices, and the probabilities that alternative decisions exist are ignored by the hard-decision process. Often the hard-decision is based on the Euclidian distances from the analog read value to electrical level(s) defining the symbols. By contrast, in the context of memory systems, the use of soft information is based on the probabilities that different outcomes exist in view of what is read from the storage medium.

In some embodiments, during a write operation, host interface 129 receives data to be stored in one or more NVM devices 140 from computer system 110. The data received by host interface 129 is made available to an encoder (e.g., encoder 126), which encodes the data to produce one or more codewords. The one or more codewords are made available to storage medium I/O 128, which transfers the one or more codewords to one or more memory channels 150 for storage in one or more NVM devices 140, in a manner dependent on the type of storage medium being utilized.

In some embodiments, a read operation is initiated when computer system (host) 110 sends one or more host read commands (e.g., via data connections 101, or alternatively a separate control line or bus) to storage controller 124 requesting data from NVM devices 140. Storage controller 124 sends one or more read access commands to NVM device 140, via storage medium I/O 128, to obtain raw read data in accordance with memory locations (physical addresses), specified, directly or indirectly, by the one or more host read commands. Storage medium I/O 128 provides the raw read data (e.g., comprising one or more codewords) to a decoder (e.g., decoder 127). If the decoding is successful, the decoded data is provided to host interface 129, where the decoded data is made available to computer system 110. In some embodiments, if the decoding is not successful, storage controller 124 may resort to a number of remedial actions or provide an indication of an irresolvable error condition.

As explained above, NVM devices 140 are divided into a number of addressable and individually selectable blocks and each block is optionally (but typically) further divided into a plurality of pages and/or word lines and/or sectors. While erasure of non-volatile memory devices is performed on a block basis, in many embodiments, reading and programming of non-volatile memory devices is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell.

The encoding format of the storage media (i.e., TLC, MLC, or SLC and/or a chose data redundancy mechanism) is a choice made when data is actually written to the storage media. Often in this specification there is described an event, condition, or process that is said to set the encoding format, alter the encoding format of the storage media, etc. It should be recognized that the actual process may involve multiple steps, e.g., erasure of the previous contents of the storage media followed by the data being written using the new encoding format and that these operations may be separated in time from the initiating event, condition or procedure.

As an example, if data is written to non-volatile memory devices in pages, but the non-volatile memory devices are erased in blocks, pages in the non-volatile memory devices may contain invalid (e.g., stale) data, but those pages cannot be overwritten until the whole block containing those pages is erased. In order to write to the pages with invalid data, the pages (if any) with valid data in that block are read and re-written to a new block and the old block is erased (or put on a queue for erasing). This process is called garbage collection. After garbage collection, the new block contains the pages with valid data and may have free pages that are available for new data to be written, and the old block can be erased so as to be available for new data to be written. Since flash memory can only be programmed and erased a limited number of times, the efficiency of the algorithm used to pick the next block(s) to re-write and erase has a significant impact on the lifetime and reliability of flash-based storage systems.

Figure 2:
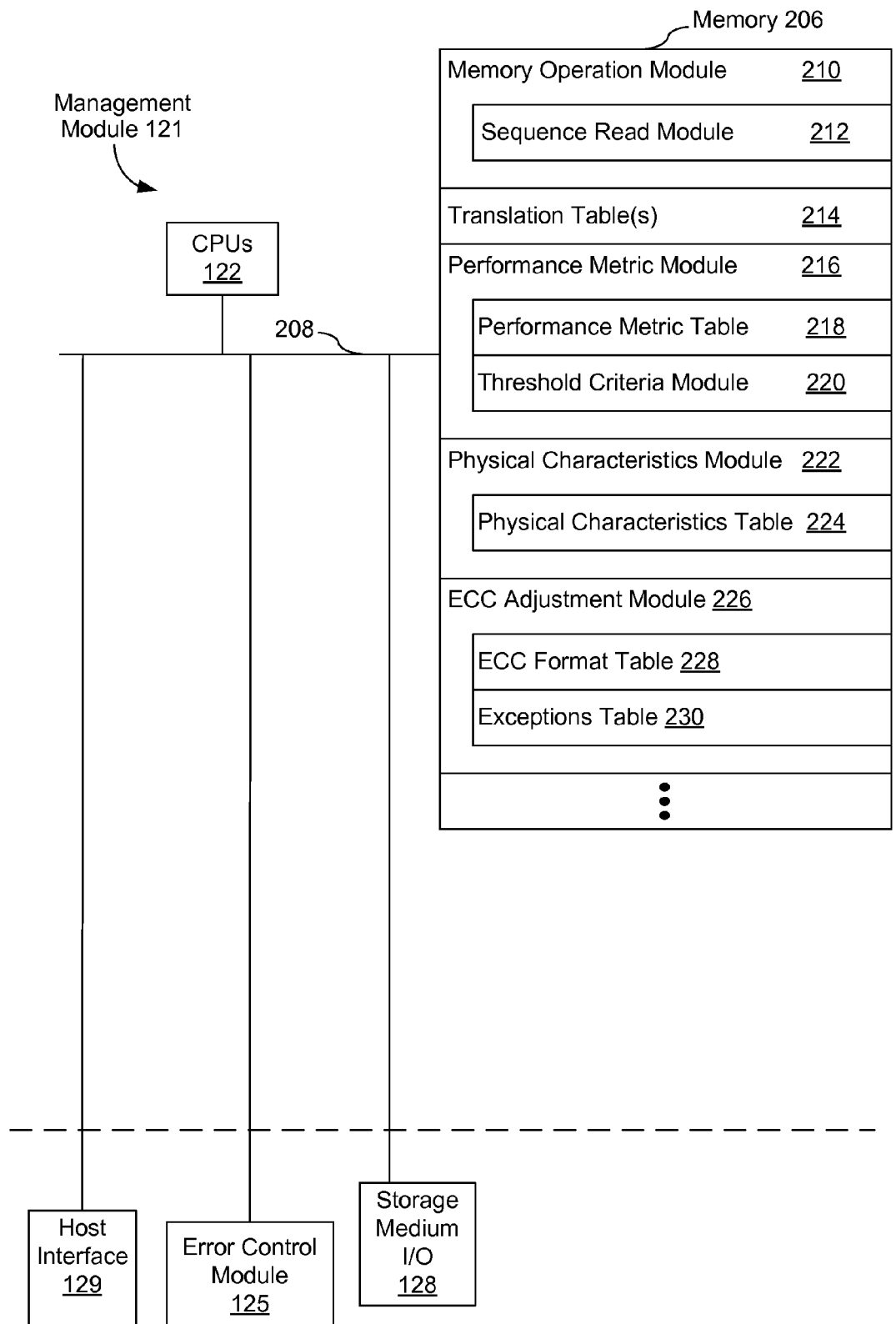
FIG. 2 is a block diagram illustrating an implementation of a management module, in accordance with some embodiments.

FIG. 2 is a block diagram illustrating an implementation of a management module 121, in accordance with some embodiments. Management module 121 typically includes one or more CPUs 122 (also sometimes called processors, processing units, microprocessors or microcontrollers) for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from CPUs 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a memory operation module 210 for dispatching commands corresponding to read, write and/or erase operations for reading data from, writing data to, or erasing data from NVM devices 140; in some implementations memory operation module 210 dispatches commands to NVM controllers 130, which in turn dispatch the commands to NVM devices 140;
- a sequence read module 212 for performing a sequential read operation (i.e., reading all or a subset of all codewords stored in multiple physical memory portions having sequential physical locations);
- translation table(s) 214 for mapping logical addresses (e.g., of logical groups of data) to physical addresses (e.g., physical locations of memory portions);
- a performance metric module 216 for measuring or otherwise obtaining a performance metric (e.g., bit error rate) for memory portions of non-volatile memory (e.g., erase blocks of NVM device 140-1, FIG. 1), which includes:
  - a performance metric table 218 for storing one or more measured performance metrics; and
  - a threshold criteria module 220 for maintaining and defining performance thresholds (e.g., threshold bit error rates), and determining whether measured (or obtained) performance metrics satisfy predefined performance thresholds;
- a physical characteristics module 222 for maintaining, identifying, and tracking physical characteristics (e.g., upper/lower page, word line location, P/E cycle count, age, etc.) of memory portions of non-volatile memory (e.g., physical pages of NVM device 140-1, FIG. 1), which includes:
  - a physical characteristics table 224 for storing physical characteristics of memory portions of non-volatile memory; and
- an error correction code (ECC) adjustment module 226 for maintaining, defining, and modifying error correction formats (e.g., modifying code rate, codeword structure, and/or error correction type) for memory portions of non-volatile memory, wherein modifying an error correction format is optionally in accordance with a measured performance metric (e.g., retrieved from performance metric module 216) for a respective memory portion, which includes:
  - an ECC format table 228 for storing error correction formats for one or more memory portions of non-volatile memory (e.g., format table 410, FIG. 4B); and
  - an exceptions table 230 for storing base correction format index values and exception values for one or more memory portions of non-volatile memory.

Each of the above identified elements (e.g., modules 210, 222, 226 and table(s) 214) may be stored in one or more of the previously mentioned memory devices (e.g., the devices that comprise memory 206 of management module 121), and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 7A-7C, 8A-8C, and 9A-9C.

Although FIG. 2 shows management module 121, FIG. 2 is intended more as a functional description of the various features which may be present in a management module than as a structural schematic of the embodiments described herein. In practice, and as recognized by those of ordinary skill in the art, items shown separately could be combined and some items could be separated. Further, although FIG. 2 shows management module 121 of storage controller 124, in embodiments that include NVM controllers (e.g., NVM controllers 130-1 through 130-$m$) in storage device 120 (FIG. 1), some of the functions shown in FIG. 2 as being implemented in management module 121 may instead be implemented, in whole or in part, in management modules (not shown) of the NVM controllers.

Figure 3:
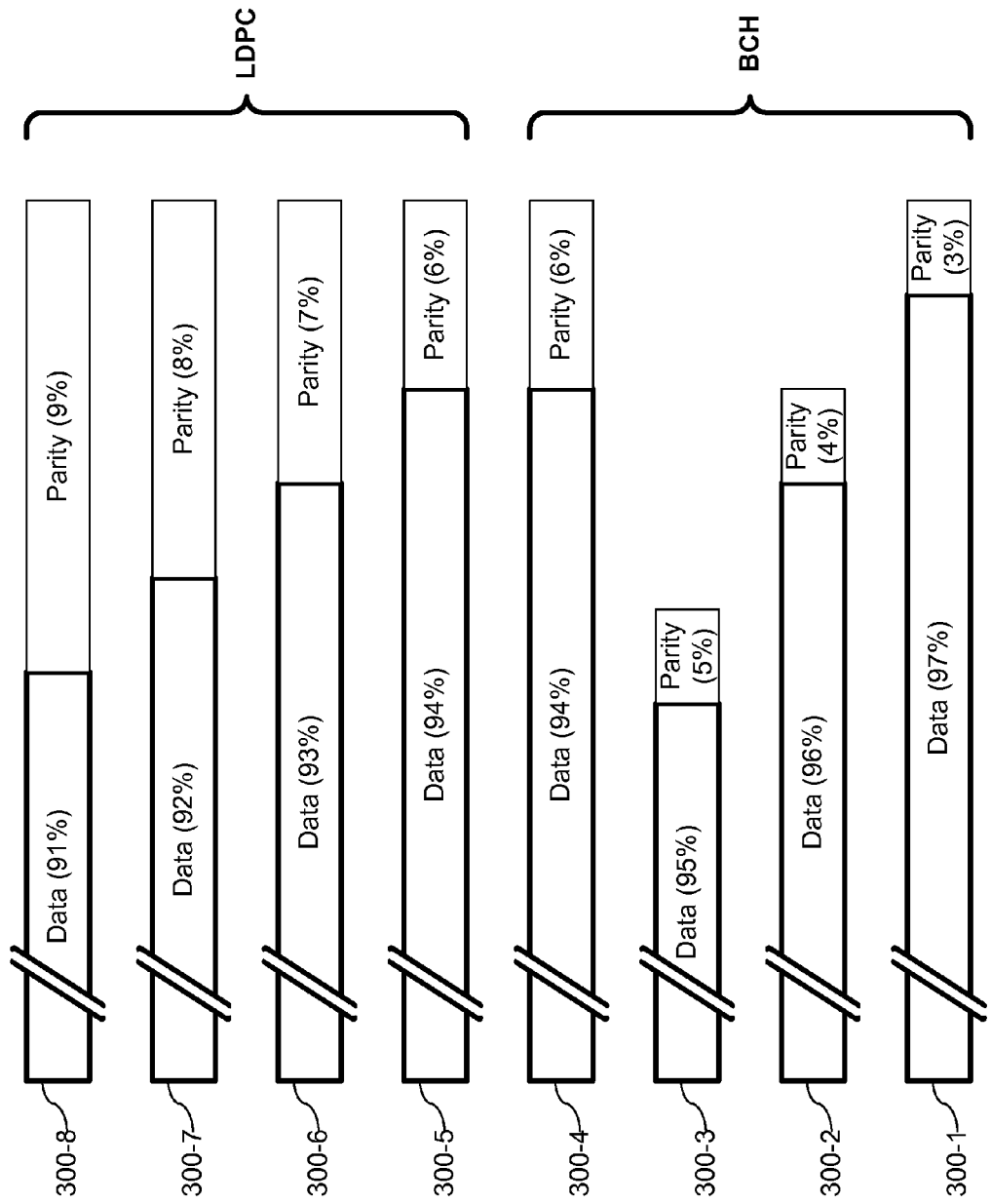
FIG. 3 illustrates codewords produced in accordance with various error correction formats, in accordance with some embodiments.

FIG. 3 illustrates codewords produced in accordance with various error correction formats, in accordance with some embodiments. As will be described below, an error correction format corresponds to a combination of an error correction type, code rate, and codeword structure for encoding and decoding data in a storage system. Furthermore, while codewords 300 illustrate a relative proportion of data to error correction bits (e.g., parity), it is understood that codewords 300 are not necessarily drawn to scale.

As described above with respect to FIG. 1, data storage system 120 can implement a variety of error correction schemes for encoding and decoding data. Systems are configured to encode and decode data in accordance with an error correction type (e.g., BCH, LDPC, etc.), which determines the types of encoders, decoders, and algorithms used for encoding and decoding data. In addition, in some embodiments, data storage system 120 is also configured to encode and decode data in accordance with a code rate and codeword structure (e.g., codeword length). The code rate is inversely related to the redundancy (e.g., parity) and error correction capability of a codeword. Specifically, code rate is typically defined as a ratio of data bits in a codeword (e.g., representing host/user data) to the size of the codeword, represented mathematically as r=K/N, where the code rate r is the ratio of the data bits K to the codeword length N. Alternatively, code rate is sometimes represented as the percentage (e.g., 94 percent) of codeword bits in a codeword that are data bits. As an example, an encoder that encodes data at a code rate of 0.94 produces codewords having 94 bits of data for every 6 error correction bits. An equivalent metric, the ECC rate (sometimes called the parity rate), is sometimes defined as the ratio of error correction bits in a codeword to the codeword length. Thus, a 6% ECC rate is equivalent to a 94% code rate. In a non-limiting example, a typical codeword size is between 1 KB and 16 KB, inclusive, such as 2 KB or 4 KB.

An error correction type (e.g., BCH), code rate (e.g., 6% parity), and codeword structure (e.g., codeword length) for encoding and decoding data define a respective error correction format (as illustrated and described in greater detail with respect to FIGS. 4A-4B). An error correction format, given its corresponding error correction type, code rate, and/or codeword structure, generally indicates a relative error correction capability (i.e., number of detectable and recoverable bits errors in a codeword) with respect to data encoded and decoded in accordance with the error correction format. For instance, referring to the examples of FIG. 3, and the corresponding error correction formats shown in FIG. 4A used to produce the codewords (codewords 300-1 through 300-8 corresponding to error correction formats "1" through "8," respectively), the error correction format with which codeword 300-6 is produced (e.g., LDPC algorithm, code rate 0.93, codeword length 4 KB) provides a higher error correction capability than the error correction format with which codeword 300-4 is produced (e.g., BCH algorithm, code rate 0.94, code length 4 KB).

Thus, varying degrees of error correction capability (and therefore error correction formats) can be achieved by modifying a code rate, codeword structure, and/or an error correction type. FIG. 3 illustrates codewords 300-1 through 300-8 produced in accordance with a variety of example error correction formats, shown in order of increasing error correction capability (from codeword 300-1 to 300-8). In some embodiments, the error correction formats used to produce codewords 300-1 to 300-8 are a predefined sequence of error correction formats. FIG. 3 also shows respective percentages of data bits and error correction bits of corresponding codewords, in addition to the corresponding error correction type (e.g., codeword 300-1 produced in accordance with a code rate of 0.97 and the BCH algorithm).

In some cases, when transitioning from one error correction format to the next error correction format in a predefined sequence of error correction formats, only a single aspect of the error correction format is modified (e.g., modifying only the error correction type from BCH to LDPC from codeword 300-4 to codeword 300-5, while keeping code rate and codeword length the same). In other cases, when transitioning from one particular error correction format to the next in a predefined sequence of error correction formats, two or more aspects of the error correction format are modified. In some cases, when transitioning from one particular error correction format to the next in a predefined sequence of error correction formats, the codeword structure (e.g., codeword length) is modified while maintaining the same code rate. In other embodiments, the number of encoded data bits and the number of error correction bits are not adjusted proportionally, thereby resulting in a modified code rate (e.g., in reducing the codeword length from codeword 300-1 to 300-2, the data bits are reduced while the number of parity bits is fixed, thus reducing the code rate from 0.97 to 0.96). In some cases or implementations, modifying the code rate includes reducing the number of error correction bits while keeping the number of data bits fixed for a respective codeword (sometimes referred to as "puncturing"). In yet other cases or implementations, modifying the code rate includes inserting bit values of zero (or alternatively, ones) into the portion of the codeword allocated for data while keeping the codeword length and the number of error correction bits fixed, such that the code rate effectively increases (sometimes referred to as "padding").

Typically (although only in some embodiments), codewords stored in many, but not all, memory portions of a storage device are initially produced (by encoding data) and decoded in accordance with the same, default error correction format. Referring to data storage system 100 of FIG. 1, for example, when storage device 120 is first placed in service, an initial default error correction format (e.g. BCH, with a code rate of 0.97 and a codeword size of 4 KB) is used to encode and decode data in all memory portions of storage device 120 other than those memory portions identified through testing as needing a different (e.g., stronger) error correction format.

Thus, codewords to be stored in a particular memory portion of a storage device are encoded and decoded in accordance with a respective error correction format for that particular memory portion (or for a group of memory portions that include the particular memory portion). A memory portion of a storage device comprises one or any combination of memory devices (e.g., NVM devices 140) of the storage device, or a portion of one or more memory devices (e.g., an individual erase block of NVM device 140-1, a plurality of erase blocks of NVM device 140-1, a portion of an erase block such as all pages of a word line in NVM device 140-1, etc.). In some embodiments, respective error correction formats for encoding data (e.g., producing codewords) to be stored in, and decoding data (e.g., codewords) from, respective memory portions of a storage device are distinct. As an example, referring to FIG. 1, data written to and retrieved from NVM device 140-1 is encoded and decoded in accordance with a first error correction format (e.g., BCH algorithm, code rate of 0.97, and codeword length of 4 KB), whereas data written to and retrieved from NVM device 140-2 is encoded and decoded in accordance with a second error correction format (e.g., LDPC algorithm, code rate of 0.94, and codeword length of 4 KB).

FIGS. 4A-4B illustrate various tables for defining and storing error correction format information, in accordance with some embodiments.

Particularly, FIG. 4A illustrates a table defining various error correction formats. As shown, format descriptor 400 is a table illustrating various error correction formats, each of which is identified by an error correction format index number and a corresponding code rate, codeword structure, and error correction type (e.g., error correction format "4" corresponds to a code rate of 0.94 (6% parity), a codeword length of 4 KB, and BCH). In some embodiments, format descriptor 400 defines a sequence of error correction formats that monotonically increases in degree of error correction capability as the format index number increases (e.g., the number of detectable and recoverable data bits of a codeword encoded with error correction format "8" is greater than that of error correction format "7") or decreases.

In some embodiments, the error correction formats shown in format descriptor 400 are predefined and configurable. That is, error correction formats may be added, modified, or removed from format descriptor 400 (e.g., by adding an error correction format "9," corresponding to a code rate of 0.89 (11% parity), a codeword length of 4 KB, and LDPC algorithm).

FIG. 4B illustrates a table for storing error correction format information for memory portions of non-volatile memory, in accordance with some embodiments.

In the example shown, format table 410 (e.g., ECC format table 228 stored in memory 206 of management module 121, FIG. 2) stores error correction format index values for each die (e.g., dies 1 through 5, corresponding to NVM device 140-1 through 140-5, FIG. 1, for example) of multiple memory channels of a storage device (e.g., channels CS1 through CS4, corresponding to memory channels 150-1 through 150-5, FIG. 1, for example). It is noted, however, that FIG. 4B is a non-limiting example, and in other implementations, format table 410 stores error correction format index values for any selectable memory portion of a memory device (e.g., each row of format table 410 stores corresponding error correction format index values for individual erase blocks of NVM device 140-1, FIG. 1).

As described in FIGS. 3 and 4A, each error correction format index value corresponds to a respective code rate, codeword structure, and error correction type for encoding data written to, and decoding data retrieved from, the corresponding memory portion identified by format table 410. For instance, referring to the examples shown in FIGS. 4A-4B, the error correction format index value stored for die 1 of channel 1 of a storage device (e.g., NVM device 140-1 of memory channel 150-1 of storage device 120, FIG. 1) is "4." Therefore, referring to the predefined error correction format information given by format descriptor 400, codewords stored in die 1 of channel 1 of the storage device are encoded and decoded with a code rate of 0.94 (6% parity), a codeword length of 4 KB, and the BCH algorithm.

As will be described with respect to FIGS. 8A-8C, in some embodiments, a current error correction format for a respective memory portion is modified in accordance with a measured performance metric (e.g., bit error rate for a respective memory portion). In some cases, modifying the current error correction format includes increasing or decreasing the current error correction format index value, where data is encoded and decoded for the respective memory portion in accordance with the code rate, codeword structure, and error correction type corresponding to the modified error correction format. As such, in some embodiments, the index values of format table 410 are modified to reflect changes to the error correction format index values. Alternatively and/or additionally, as described in greater detail with respect to FIGS. 8A-8C, an exceptions table (e.g., exceptions table 230) is stored that includes error correction format index values for only those memory portions of a storage device that deviate from a base error correction format (e.g., if NVM 140-1 of FIG. 1 is the only non-volatile memory device in memory channel 150-1 that has a measured bit error rate exceeding a predefined threshold, a base error correction format index value of "1" is increased to "2" and accordingly stored in exceptions table 230).

Figure 5A:
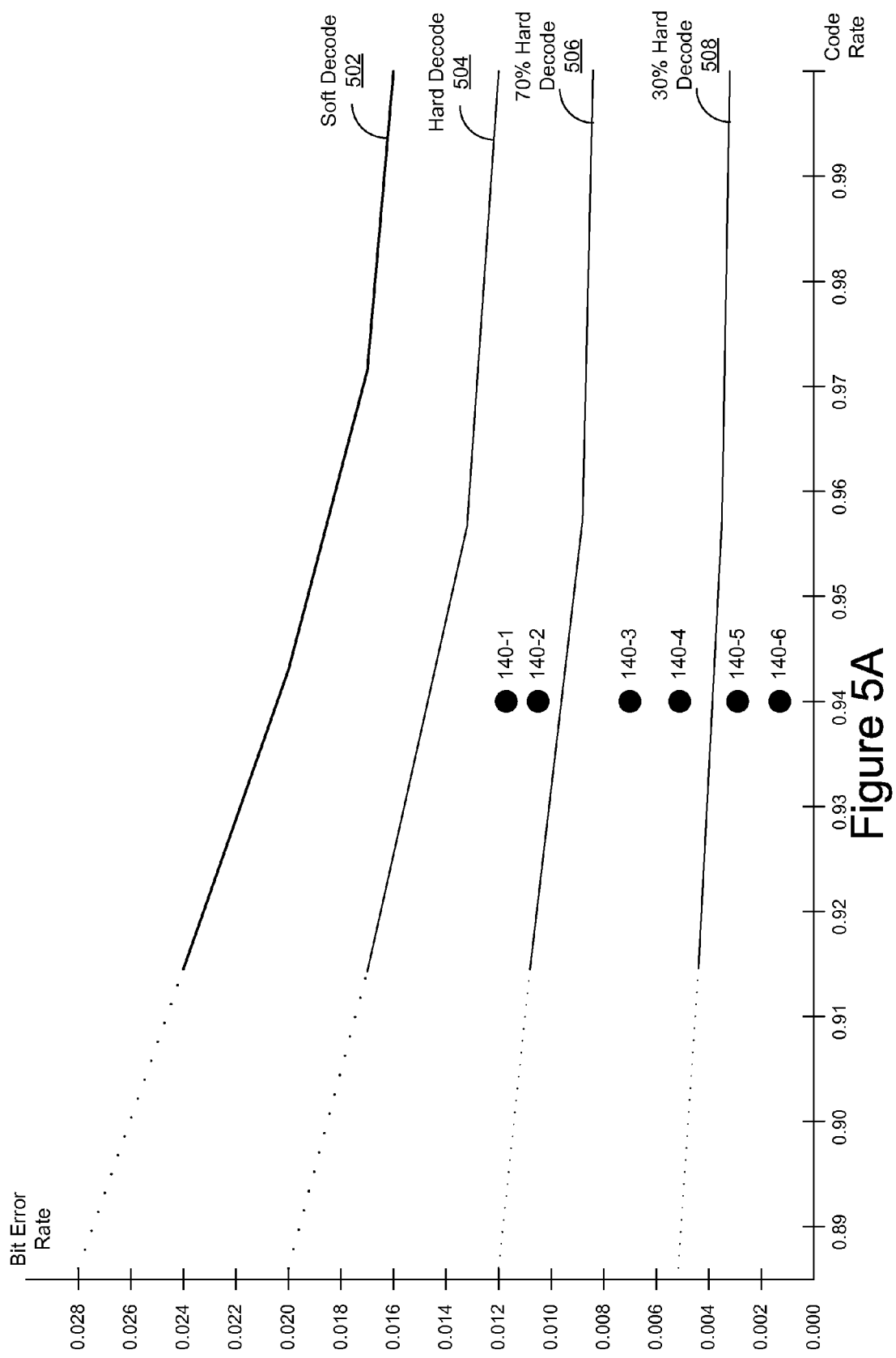
FIGS. 5A-5B are prophetic illustrations of performance metrics for memory portions of a storage device, in accordance with some embodiments.
Figure 5B:
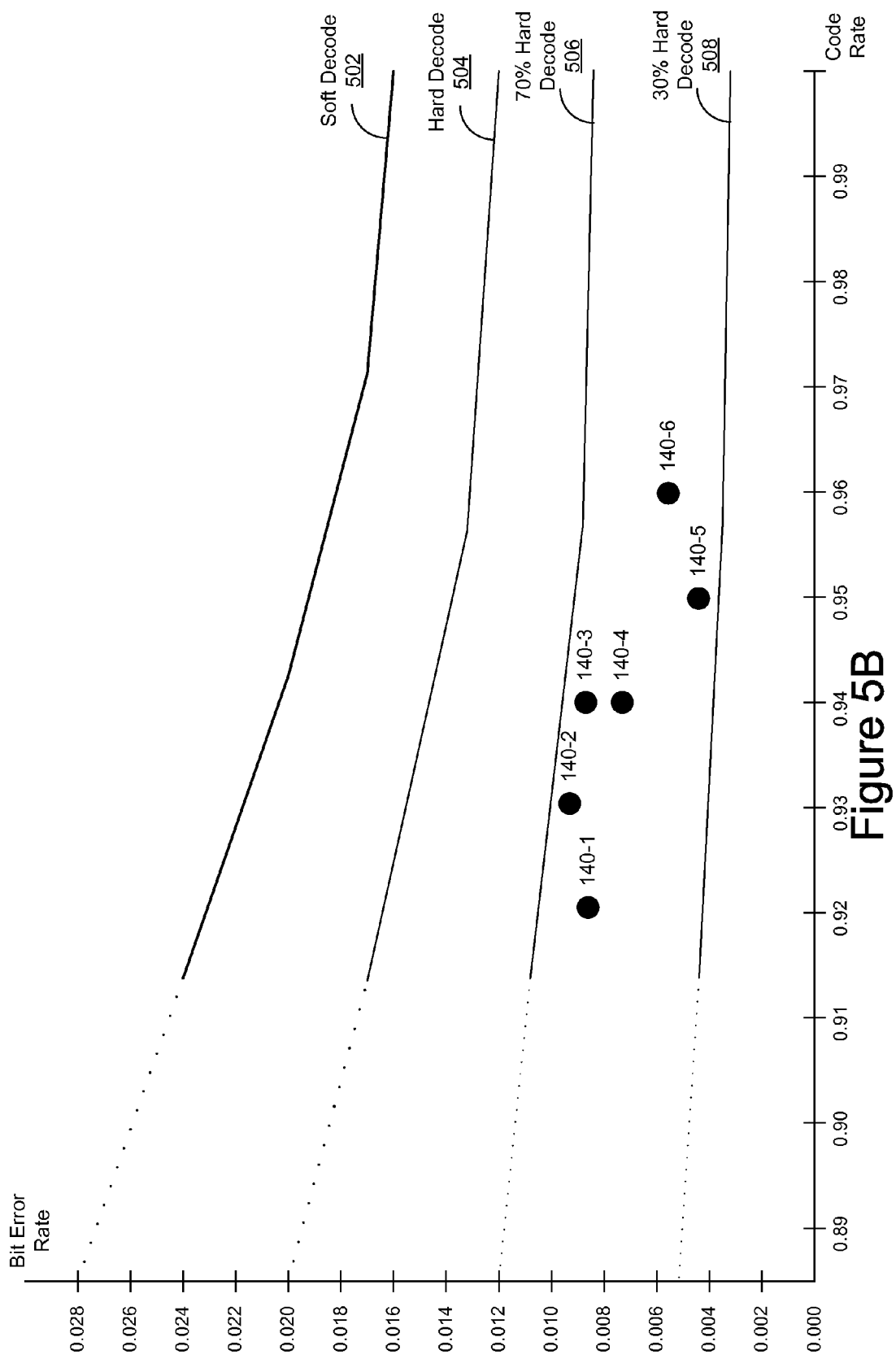

FIGS. 5A-5B are prophetic illustrations of measured performance metrics for memory portions of a storage device, in accordance with some embodiments.

In particular, FIG. 5A illustrates a non-limiting example in which performance metrics (e.g., bit error rate) are measured for respective memory portions of a storage device (e.g., NVM device 140-1 through 140-6 of memory channel 150-1, FIG. 1), where codewords stored in the respective memory portions are encoded and decoded in accordance with a respective error correction format (e.g., corresponding code rate, codeword length, and error correction type). The respective error correction formats of the memory portions are then modified in accordance with the measured performance metrics and predefined thresholds (e.g., thresholds 502, 504, etc.). Subsequently, as shown by the non-limiting example of FIG. 5B, performance metrics are measured for the memory portions based on the modified error correction formats.

Referring to the example of FIG. 5A, a bit error rate is measured for each of NVM devices 140-1 through 140-6 (e.g., of memory channel 150-1, FIG. 1), where codewords stored in the non-volatile memory devices are encoded and decoded in accordance with a respective error correction format. Based on the example illustrated and format descriptor 400 of FIG. 4A, each of NVM devices 140-1 through 140-6 have the same corresponding error correction format "4" (e.g., a code rate of 0.94 (6% parity), a codeword length of 4 KB, and BCH encoding).

In this example, the measured bit error rates for each of the non-volatile memory devices range from approximately 0.002 to 0.012 (i.e., 2 to 12 bit errors detected for every 1000 bits of decoded data from a respective NVM device 140). In some cases, the observed range of measured bit error rates across non-volatile memory devices is a consequence of natural variations in quality over non-volatile memory devices (e.g., dies, erase blocks, pages). Given the impact of such variations on the performance of non-volatile memory devices, in some situations, encoding and decoding data in accordance with the same error correction format for all the non-volatile memory devices in a storage device does not optimize data redundancy (i.e., parity) and system efficiency (e.g., number of encode and decode operations for processing a given amount of user data). That is, to satisfy predefined performance thresholds (e.g., requiring that each NVM device 140 achieves a bit error rate between thresholds 506 and 508, as described in greater detail with respect to FIGS. 8A-8C), some non-volatile memory devices require less error correction capability (e.g., NVM devices 140-5 and 140-6 having BERs less than 30% of the hard decode limit) and some require greater error correction capability (e.g., NVM devices 140-1 and 140-2 having BERs greater than 70% of the hard decode limit).

Thus, to optimize data redundancy and system efficiency when possible, error correction formats for respective memory portions of a storage device are modified to satisfy the predefined performance thresholds.

FIG. 5B illustrates bit error rates for each of NVM devices 140-1 through 140-6, where the bit error rates reflect measurements taken after respective error correction formats for the non-volatile memory devices have been modified in accordance with the predefined performance thresholds and measured bit error rates, as discussed above with respect to FIG. 5A.

For example, because the measured bit error rates for NVM devices 140-1 and 140-2 in FIG. 5A are greater than predefined threshold 506 (e.g., 70% of the hard decode threshold, corresponding to a bit error rate of approximately 0.009 for a code rate of 0.94), the respective error correction formats for NVM devices 140-1 and 140-2 are modified to satisfy the predefined threshold. In the example shown, the modified error correction format for NVM device 140-1 corresponds to a code rate of 0.92 (e.g., error correction format "7," FIG. 4A), and the modified error correction format for NVM device 140-2 corresponds to a code rate of 0.93 (e.g., error correction format "6"). Given the modified error correction formats, the measured bit error rates for both NVM devices 140-1 and 140-2 decrease to approximately 0.008 and 0.010, respectively, thereby satisfying threshold 506.

In another example, because the measured bit error rates for NVM devices 140-5 and 140-6 in FIG. 5A are less than predefined threshold 508 (e.g., 30% of the hard decode threshold, corresponding to a bit error rate of approximately 0.004 for a code rate of 0.94), the respective error correction formats for NVM devices 140-5 and 140-6 are modified to satisfy the predefined threshold. In the example shown, the modified error correction format for NVM device 140-5 corresponds to a code rate of 0.95 (e.g., error correction format "3," FIG. 4A), and the modified error correction format for NVM device 140-6 corresponds to a code rate of 0.96 (e.g., error correction format "2"). Given the modified error correction formats, the measured bit error rates for both NVM devices 140-5 and 140-6 increase to approximately 0.005 and 0.006, respectively, thereby satisfying threshold 508.

The measured bit error rates for NVM devices 140-3 and 140-4 in FIG. 5A already satisfy both predefined thresholds 506 and 508. In some implementations, however, the respective error correction formats for NVM devices 140-3 and 140-4 are nevertheless modified such that data redundancy and system efficiency are optimized, while still satisfying both predefined thresholds 506 and 508. For example, referring to FIG. 5B, the modified error correction formats for NVM devices 140-3 and 140-4 correspond to an unchanged code rate of 0.94, but are modified with respect to an encoding type (e.g., decreasing from error correction format "5" to "4," where the encoding type is changed from LDPC to BCH, FIG. 4A).

Performance metrics and modifying error correction formats are described in greater detail with respect to FIGS. 7A-7C and 8A-8C.

Figure 6:
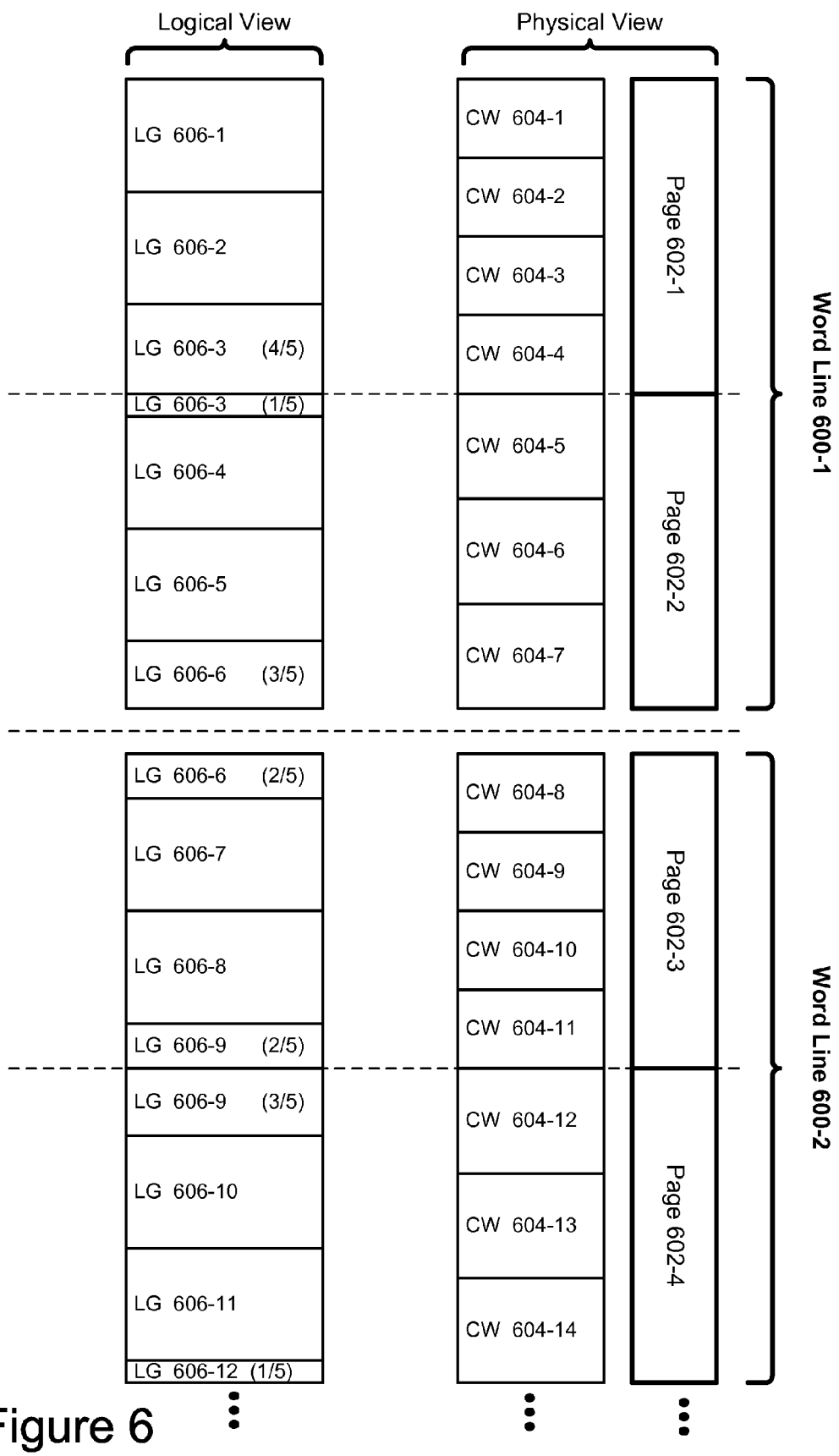
FIG. 6 represents physical and logical views of data in a storage device, in accordance with some embodiments.

FIG. 6 represents physical and logical views of data in a storage device, in accordance with some embodiments.

As shown in FIG. 6, logical groups of data (as shown in the "logical view") are stored in codewords, which are produced by encoding the logical groups of data (e.g., codewords 604-1 and 604-2 include user data comprising logical group 606-1). The "physical view" portion of FIG. 6 illustrates physical locations of the codewords and the physical memory portions to which they correspond (e.g., codewords 604-1 and 604-2 have physical locations corresponding to physical page 602-1 of word line 600-1 of NVM device 140-1, memory channel 150-1, FIG. 1). Reading logical groups of data that are mapped to physical locations in different physical memory portions typically requires the execution of multiple read operations (e.g., logical group 606-3 has user data located in codeword 604-4 of physical page 602-1 and codeword 604-5 of physical page 602-2). However, as explained below, some implementations include the execution of a single sequential read operation to read logical groups of data corresponding to physical memory portions at sequential physical locations, thereby minimizing the number of read operations required to read some logical groups of data, despite their being stored in two or more distinct physical memory portions.

Logical groups (e.g., logical groups 606-1 through 606-12), sometimes referred to as virtual pages, are groups of user data, representing predefined units of user data seen and used by a host system for performing memory operations (e.g., writing data to or reading data from storage device 120, FIG. 1), where logical groups have logical addresses (e.g., logical addresses in a logical address space of computer system 110, FIG. 1). In some embodiments, all logical groups of data have the same amount of user data (i.e., data excluding ECC bits) per logical group. As a non-limiting example, a logical group of data has 4 KB or 8 KB of user data.

In executing a write command (as described above with respect to FIG. 1), computer system 110 sends logical group 606-1 to host interface 129, which is made available to encoder 126 for producing codewords 604-1 and 604-2. Codewords 604-1 and 604-2 are then made available to storage medium I/O 128, which transfers the codewords to memory channel 150-1 for storage in one or more physical locations, namely page 602-1 of word line 600-1 (e.g., NVM device 140-1). In some embodiments, one or more forward translation tables (e.g., translation tables 214 of memory 206, FIG. 2) include mapping information that identifies the physical locations in memory to which the logical groups of data are mapped. In some embodiments, the codewords produced for user data of a logical group are stored in one or more memory portions of a non-volatile memory device. In some implementations, each codeword produced for user data of a logical group is stored in a single memory portion of a non-volatile memory device (e.g., each codeword is stored in a single physical page of a non-volatile memory device). Stated another way, in some implementations, individual codewords are not split across memory portions of non-volatile memory, but logical groups of data can be split across memory portions of non-volatile memory, such as when the codewords for a logical group of data are stored in two memory portions (e.g., two distinct pages) of non-volatile memory.

Physical memory portions of a storage device (e.g., pages 602-1 and 602-2), in which codewords are stored, have a predefined sequence of physical locations in one or more memory devices of the storage device. In some embodiments, physical memory portions have sequential physical locations if the physical memory portions share a word line (e.g., adjacent physical pages connected to the same word line of a non-volatile memory device). Thus, referring to the example of FIG. 6, physical pages 602-1 and 602-2 have sequential physical locations (e.g., the corresponding physical locations of codewords 604-4 and 604-5) because they are adjacent physical pages connected to the same word line (600-1). In some embodiments, physical memory portions have non-sequential physical locations if the physical memory portions do not share a word line (e.g., physical pages connected to different word lines of a non-volatile memory device). For example, referring again to FIG. 6, physical pages 602-2 and 602-3 have non-sequential physical locations (e.g., the corresponding physical locations of codewords 604-7 and 604-8) because they are connected to distinct and adjacent word lines 600-1 and 600-2. In this later example, the two pages have non-sequential physical locations within the same die (e.g., the same flash memory die). In another example, two pages having non-sequential physical locations are located within different die (e.g., two different flash memory die).

Figure 9A:
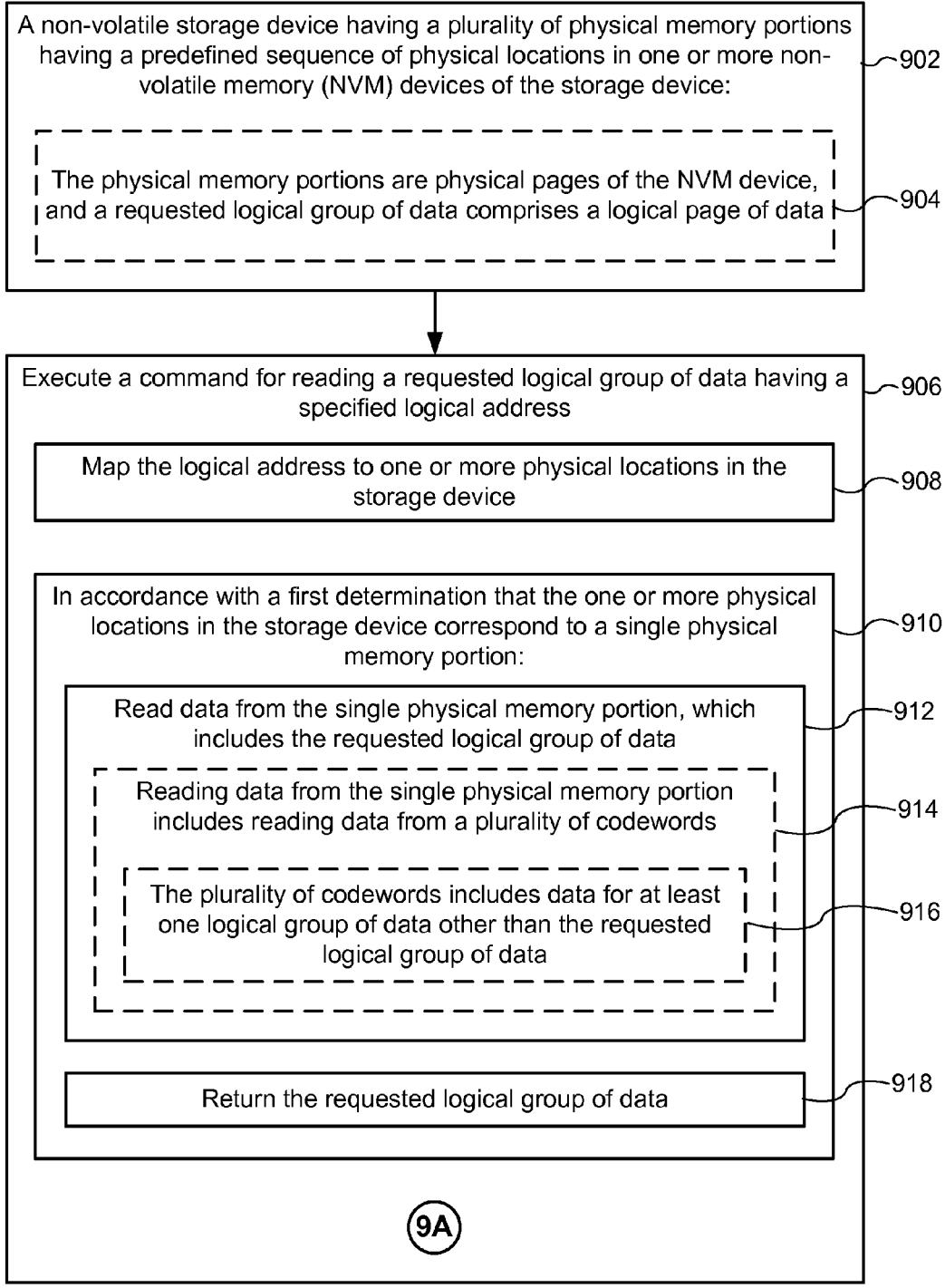
FIGS. 9A-9C illustrates a flowchart representation of a method for reading data stored in a non-volatile memory device, in accordance with some embodiments.
Figure 9B:
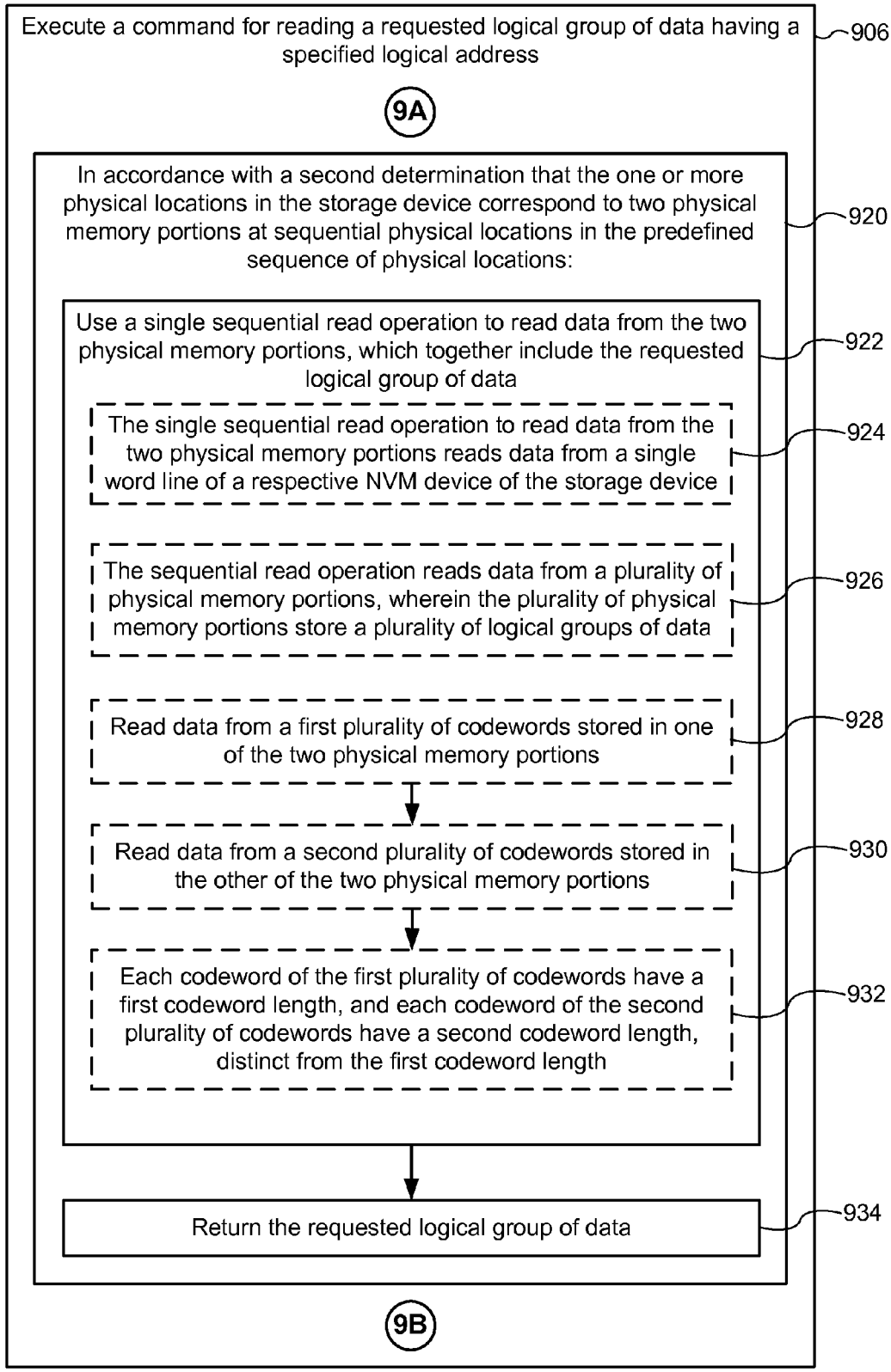
Figure 9C:
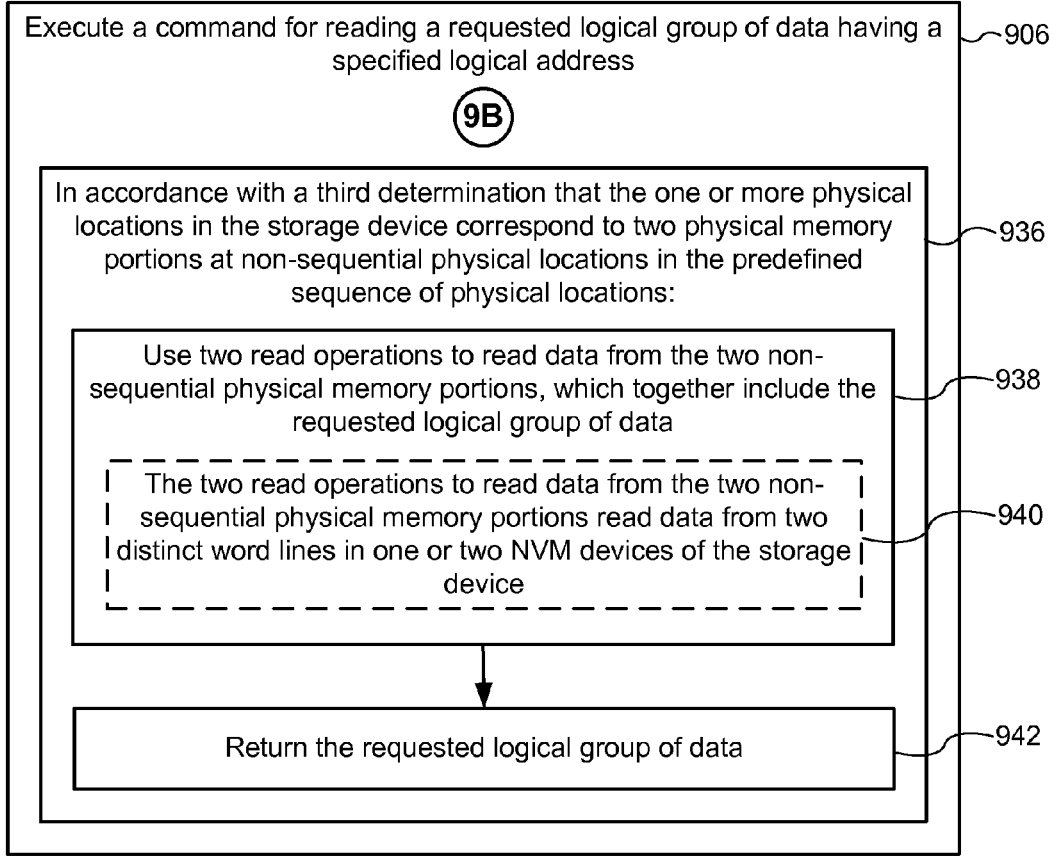

As described in greater detail with respect to FIGS. 9A-9C, the type and number of read operations used in executing a command for reading a requested logical group of data depends on the physical locations (in the storage device) to which the logical group of data is mapped.

In one example, if it is determined that a requested logical group of data has one or more physical locations in the storage device corresponding to a single physical memory portion, a single read operation is used to return the requested logical group of data. For example, to read data from logical group 606-1, which corresponds to codewords 604-1 and 604-2 both having physical locations in physical page 602-1, a single read operation of physical page 602-1 is performed. In some implementations, in performing the single read operation, all or a subset of all codewords 604-1 through 604-4 stored in physical page 602-1 are retrieved by storage medium I/O 128 (FIG. 1) and provided to decoder 127, where decoded data corresponding to requested logical group 606-1 is made available to computer system 110.

However, in a second example, if it is determined that a requested logical group of data has one or more physical locations in the storage device corresponding to two physical memory portions having sequential physical locations, a single sequential read operation is performed to return the requested logical group of data. In contrast to a read operation for reading data from a single physical memory portion (as described in the example above), in some implementations, a sequential read operation includes reading data from (i.e., reading all or a subset of all codewords stored in) multiple physical memory portions having sequential physical locations. For example, logical group 606-3 corresponds to codewords 604-4 and 604-5, where codeword 604-4 is physical located on physical page 602-1 on word line 600-1, and codeword 604-5 is physically located on physical page 602-2 on word line 600-1. Although codewords 604-4 and 604-5 are located in different physical memory portions, the physical memory portions have sequential physical locations, and thus a single sequential read operation is executed to read the requested data (e.g., a single sequential read operation for retrieving and decoding all codewords across physical pages 602-1 and 602-2 to read the requested data for logical group 606-3). Consequently, all or a subset of all codewords 604-1 through 604-7 across physical pages 602-1 and 602-2 are retrieved by storage medium I/O 128 (FIG. 1) and provided to decoder 127, where decoded data corresponding to requested logical group 606-3 is made available to computer system 110. By performing a single sequential read operation, fewer read operations are required and system efficiency is thereby improved in comparison with implementations in which reading a logical group of data stored in two or more sequential physical memory portions (e.g., logical group 606-3) is read by performing a plurality of separate read operations (e.g., one read operation to read page 602-1 and another to read page 602-2).

In a third example, if it is determined that a requested logical group of data has one or more physical locations in the storage device corresponding to two physical memory portions having non-sequential physical locations, multiple read operations are performed to return the requested logical group of data. For example, logical group 606-6 corresponds to codewords 604-7 and 604-8, where codeword 604-7 is located (i.e., stored) in physical page 602-2 on word line 600-1, and codeword 604-8 is located in physical page 602-3 on word line 600-2. Because codewords 604-7 and 604-8 correspond to physical memory portions that are not adjacent and that do not share the same word line, they correspond to non-sequential physical locations, and therefore two separate read operations are used. Consequently, in performing the first of two read operations, all or a subset of all codewords 604-5 through 604-7 stored in physical page 602-2 are retrieved by storage medium I/O 128 (FIG. 1) and provided to decoder 127, and in performing the second read operation, all or a subset of all codewords 604-8 through 604-11 stored in physical page 602-3 are retrieved by storage medium I/O 128 and provided to decoder 127. After performing the two read operations, decoded data corresponding to requested logical group 606-6 is made available to computer system 110.

Ideally, encoding parameters (e.g., a code rate and/or a codeword structure) and the size of logical groups in a host system (e.g., data storage system 100) would be configured such that the physical memory portions of a storage device include an integer number of codewords corresponding to an integer number of logical groups (e.g., a system is configured such that each physical page of a non-volatile memory device stores four codewords, where the codewords and logical groups are configured such that two codewords include all the user data of a single logical group of data). Integer correspondence between memory portions, codewords, and logical groups would allow systems to perform single read operations in retrieving any single logical group of data.

However, in some implementations of a data storage device that employs multiple error correction formats when storing data in different memory portions of the data storage device, such integer correspondence between memory portions, codewords, and logical groups is not possible without sacrificing (e.g., by storing null data in) a significant portion of the storage device's available storage space. That is, in such implementations, as least some logical groups of data no longer correspond to an integer number of codewords, and some codewords store data for more than one logical group of data, and thus at least some logical groups of data corresponding to non-integer numbers of codewords. Furthermore, in some situations, the user data for a logical group of data is stored in codewords having physical locations in two or more distinct memory portions of a storage device (e.g., with respect to logical group 606-3, codeword 604-4 is physically located in physical page 602-1, and codeword 604-5 is physically located in physical page 602-2). In these situations, the methods describe above and with respect to FIGS. 9A-9C for reading requested logical groups of data are implemented accordingly (e.g., using a single sequential read operation to read a requested logical group of data that has one or more physical locations corresponding to two physical memory portions having sequential physical locations).

Figure 7A:
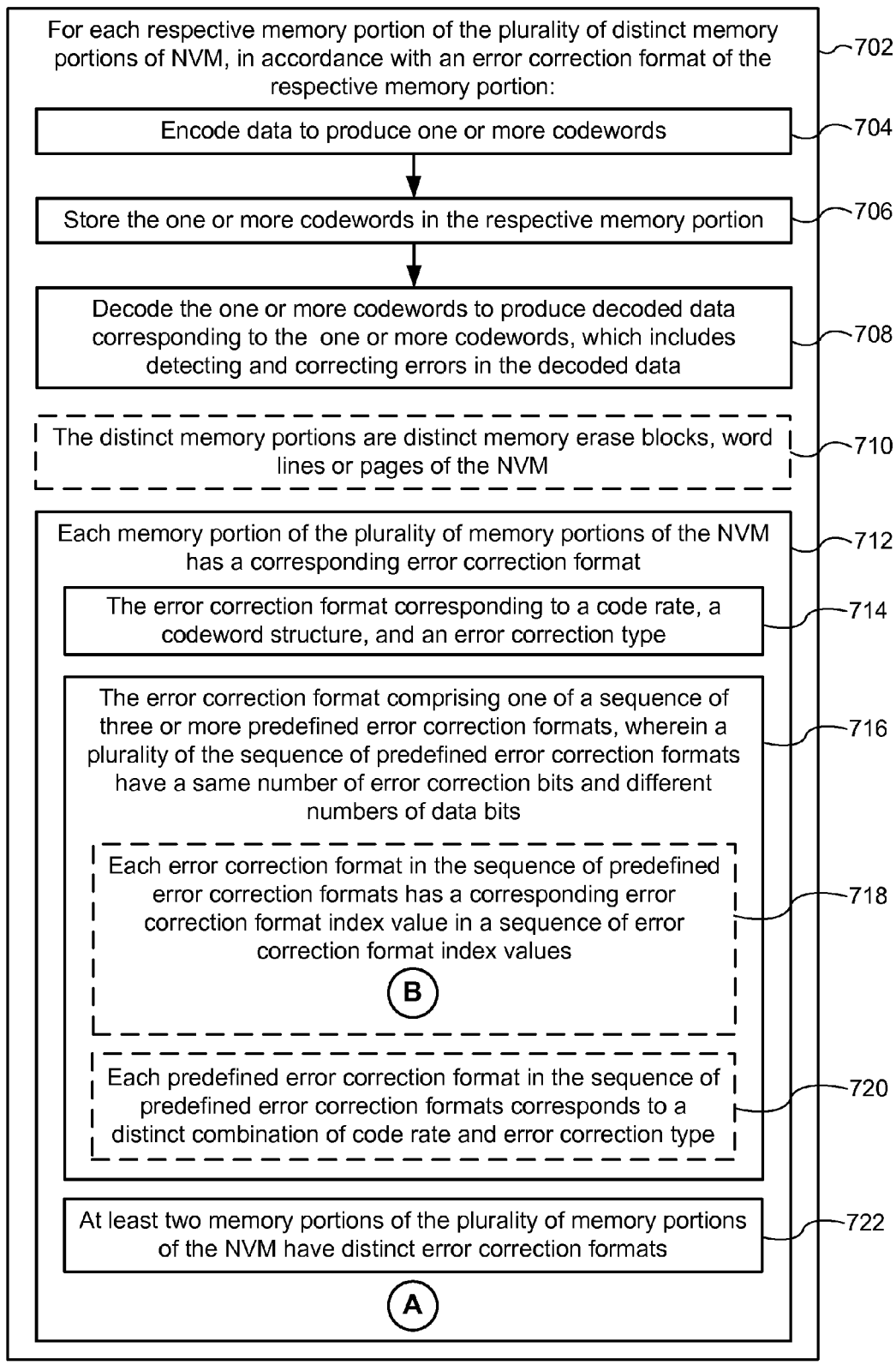

FIGS. 7A-7C illustrate a flowchart representation of a method 700 of encoding and decoding data for a plurality of memory portions of non-volatile memory in a data storage device, in accordance with some embodiments. Method 700 coordinates and manages multiple sub-system components of a storage device to encode and decode data in accordance with an error correction format of a respective memory portion. At least in some implementations, one or more steps of method 700 are performed by a storage device (e.g., storage device 120, FIG. 1) or one or more components of the storage device (e.g., storage controller 124, management module 121, error control module 125, and/or NVM controllers 130, FIG. 1). In some embodiments, method 700 is governed by instructions that are stored in a non-transitory computer readable storage medium and that are executed by one or more processors of a device, such as the one or more processors 122 of management module 121 (FIG. 2) in storage controller 124, and/or the one or more processors of NVM controllers 130 (not shown).

For each respective memory portion of a plurality of distinct memory portions of non-volatile memory (NVM) in a storage device (e.g., NVM devices 140-1 through 140-n of memory channel 150-1 in storage device 120, FIG. 1), in accordance with an error correction format of the respective memory portion, the storage device encodes (704) data to produce one or more codewords, stores (706) the one or more codewords in the respective memory portion, and (e.g., at a later time, in response to a host read command) decodes (708) the one or more codewords to produce decoded data corresponding to the one or more codewords, which includes detecting and correcting errors in the decoded data. In some embodiments, the distinct memory portions are (710) distinct memory erase blocks, word lines or pages of the non-volatile memory (e.g., erase blocks of NVM 140-1, FIG. 1).

Each memory portion of the plurality of memory portions of the non-volatile memory has (712) a corresponding error correction format. The error correction format corresponds (714) to a code rate, a codeword structure, and an error correction type. For example, format descriptor 400 of FIG. 4A illustrates various error correction formats, each corresponding to a code rate (e.g., 0.95), codeword structure (e.g., 2 KB codeword length), and error correction type (e.g., LDPC). Therefore, in a non-limiting example (referring to FIG. 4A), if an erase block of NVM device 140-1 (e.g., in storage device 120, FIG. 1) has a corresponding error correction format index of "3," data is encoded (step 704) to produce one or more codewords, the one or more produced codewords are stored (step 706), and (at a later time, in response to a host read command) the one or more produced codewords are decoded (step 708), in accordance with a code rate of 0.95 (5% parity), a codeword length of 3 KB, and the BCH algorithm.

Furthermore, the error correction format comprises (716) one of a sequence of three or more predefined error correction formats, wherein a plurality of the sequence of predefined error correction formats have a same number of error correction bits and different numbers of data bits. FIG. 3 illustrates example codewords (e.g., codewords 300-1 through 300-8), each of which is produced in accordance with a distinct error correction format in a sequence of predefined error correction formats. Specifically, in the example shown (not drawn to scale), codewords 300-1 through 300-3 are produced in accordance with respective error correction formats that have a same number of error correction bits and different numbers of data bits.

In some embodiments, each error correction format in the sequence of predefined error correction formats has (718) a corresponding error correction format index value in a sequence of error correction format index values. For example, referring to FIG. 4A, format descriptor 400 defines a sequence of error correction formats identified by error correction format index numbers (e.g., "1" through "8"), shown in order of increasing error correction capability (e.g., error correction format "1" having the lowest relative error correction capability, and "8" having the highest). In some embodiments, a sequence of error correction format index values is arbitrarily defined, and is not in order of increasing or decreasing error correction capability. Furthermore, in some embodiments, the sequence of predefined error correction formats is modified. Modifying includes, for example, modifying corresponding error correction parameters of an existing error correction format in the sequence (e.g., changing parity of error correction format "8" from 9% to 10%), adding an additional error correction format in the sequence (e.g., adding error correction format "9," corresponding to 12% parity, 4 KB codewords, and LDPC encoding, for example), and/or removing an existing error correction format from the sequence (e.g., removing error correction format "8," resulting in a sequence of seven error correction formats). In some embodiments, each predefined error correction format in the sequence of predefined error correction formats corresponds (720) to a distinct combination of code rate and error correction type (e.g., as shown by error correction formats "1" through "8," FIG. 4A). In some implementations, the distinct error correction formats are distinct with respect to at least one of the code rate, a codeword structure, and an error correction type.

Optionally, the corresponding error correction format index values of two or more memory portions of the plurality of memory portions of the non-volatile memory are stored (728, FIG. 7B) in a table (e.g., ECC format table 228, FIG. 2). For example, FIG. 4B illustrates format table 410 for storing error correction format information for respective memory portions (e.g., dies 1 through 6 across memory channels 1 through 4) of non-volatile memory in a storage device.

At least two memory portions of the plurality of memory portions of the non-volatile memory have (722) distinct error correction formats. For example, referring to FIG. 4B, die 1 and die 2 of memory channel 2 have distinct error correction formats (e.g., die 1 corresponding to error correction format "3" and die 2 corresponding to error correction format "1").

Referring now to FIG. 7B, in some embodiments, the error correction format of two or more memory portions of the plurality of memory portions is (724) a base error correction format selected in accordance with physical characteristics of the two or more memory portions. Physical characteristics include, for example, whether a memory portion is the upper/lower page in an MLC flash memory device (in which each memory cell stores two bits, one in a lower page and one in an upper page), and/or the location of an associated word line within an erase block. For example, if a particular memory portion is an upper page in an MLC flash memory device, then the base error correction format for that memory portion is incremented by one index value (e.g., from "1" to "2"), or other predefined differential such as two index values (e.g., from "1" to "3"), over the base error correction format for a larger memory portion (e.g., an erase block, or plane, or memory die) than the particular memory portion. In another example, in memory devices having three dimensional arrays of memory cells, if a memory portion is a physical page located on a word line that is closest to the substrate relative to other word lines in the non-volatile memory, then the base error correction format for that memory portion is incremented by a predefined number of index values, such as one or two. In yet another example, if a memory portion is an "edge region" of an erase block (e.g., a predefined number of word lines located or near both edges, sometimes called the top and bottom edges, of an erase block), then the base error correction format for that memory portion is incremented by a predefined number of index values, such as one index value or two index values.

For example, in some embodiments, each die is assigned a die-level base error correction format, with a corresponding base index value, based on a measured performance metric, and each block (e.g., erase block) within the die that needs a different error correction format is assigned an exception value to specify a block-level base error correction format for that block. In addition, within each block, data written to (i.e., stored in) the upper pages are automatically encoded with an error correction format corresponding to the index value for base error correction format for the block plus a first predefined differential (e.g., a differential of one or two). Optionally, in addition to the differential encoding data written to upper pages, data written to (i.e., stored in) predefined edge regions of the block (e.g., certain lower pages on word lines at or near the edges of the block) are automatically encoded with an error correction format corresponding to the index value for block-level base error correction format for the block plus a second predefined differential (e.g., a differential of one or two).

In some implementations, physical characteristics include a program-erase (P/E) cycle count, an age metric of the respective memory portion, and/or a semi-conductor process metric or performance metric (e.g., a metric having a different value for high-performing NVM die or other memory portions, average-performing NVM die or other memory portions, and low-performing NVM die or other memory portions, based on initial wafer testing or post-assembly testing).

In some embodiments, for a respective memory portion of the plurality of memory portions of the non-volatile memory, a performance metric of the respective memory portion is obtained (e.g., measured or read from a known memory or register location) (730). Furthermore, the error correction format of the respective memory portion is modified (732) in accordance with the obtained performance metric, and an error correction format index value corresponding to the modified error correction format is recorded (734) in the table. As a non-limiting example, referring to FIG. 5A, the bit-error rate for NVM device 140-1 is measured, and determined to exceed predefined threshold 506 (e.g., a 70% of the hard decode limit). As shown in FIG. 5B, the corresponding error correction format for NVM device 140-1 is therefore increased from a 0.94 code rate (e.g., format "4") to a 0.92 code rate (e.g., format "7"), which is optionally recorded in a table (e.g., ECC format table 228, FIG. 2). As a result, as shown in FIG. 5B, the bit-error rate measured when reading from NVM device 140-1 data stored in NVM device 140-1 with the modified error correction format falls below the predefined threshold 506. Measuring (or otherwise obtaining) performance metrics and modifying respective error correction formats of memory portions accordingly is discussed in greater detail with respect to FIGS. 8A-8C.

Referring now to FIG. 7C, in some embodiments, the plurality of distinct memory portions of non-volatile memory in the storage device include (736) a plurality of distinct memory portions of non-volatile memory in each of a plurality of non-volatile memory die. For example, referring to FIG. 1, each NVM device 140-1 to 140-n includes a plurality of distinct memory portions. The storage devices stores (738), in one or more tables (e.g., exceptions table 230, FIG. 2), a base correction format index value (740) for each non-volatile memory die of the plurality of non-volatile memory die, the base correction format index value for a respective non-volatile memory die indicating a default error correction format for memory portions in the non-volatile memory die. Furthermore, the storage devices stores, in the one or more tables (e.g., exceptions table 230), a plurality of exception values (742), each exception value indicating, for a corresponding memory portion of particular non-volatile memory die of the plurality of non-volatile memory die, an error correction format distinct from the default error correction format for memory portions in the particular non-volatile memory die.

Figure 8A:
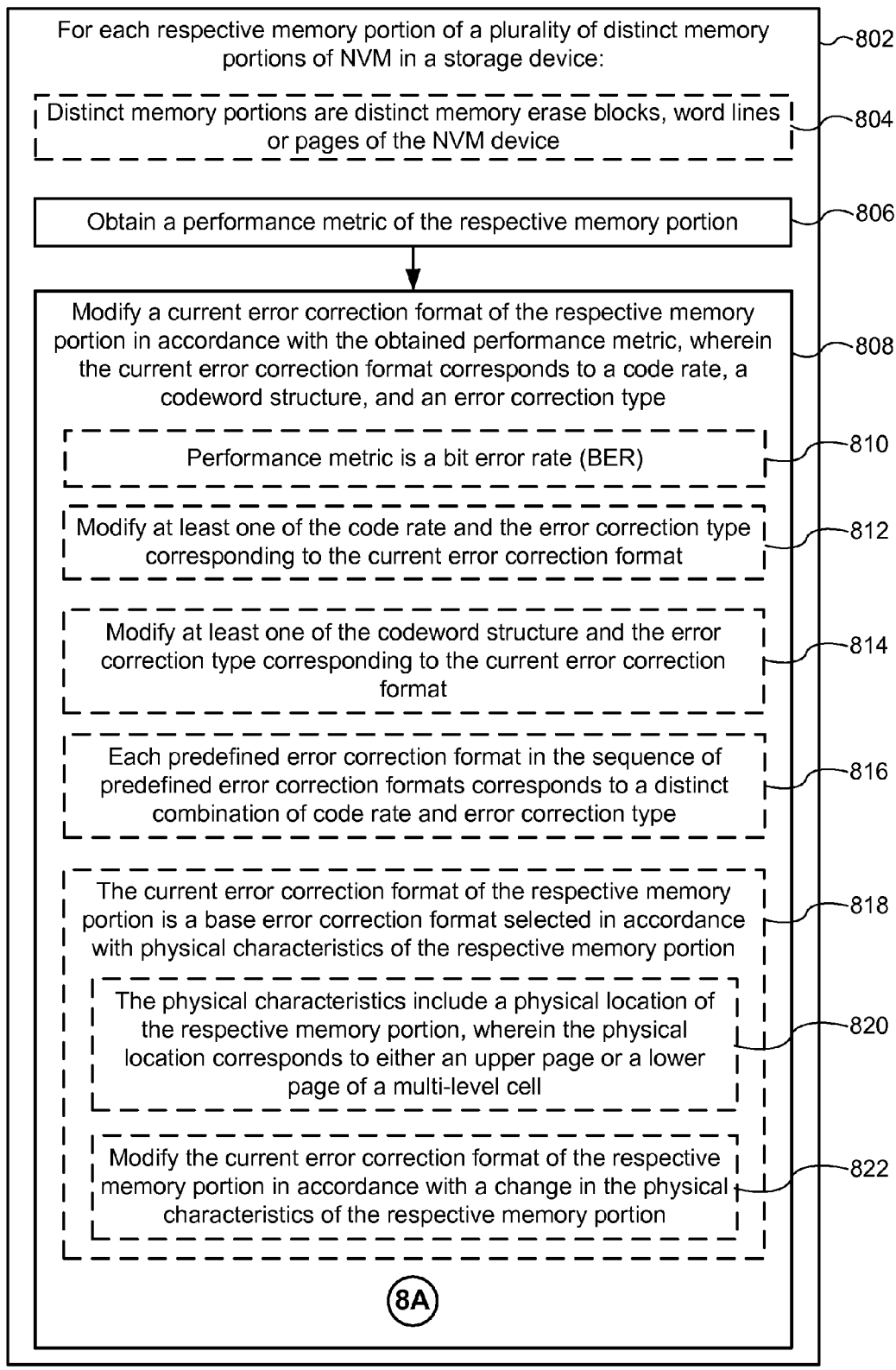
FIGS. 8A-8C illustrate a flowchart representation of a method of modifying an error correction format of a respective memory portion of a non-volatile memory device, in accordance with some embodiments.
Figure 8B:
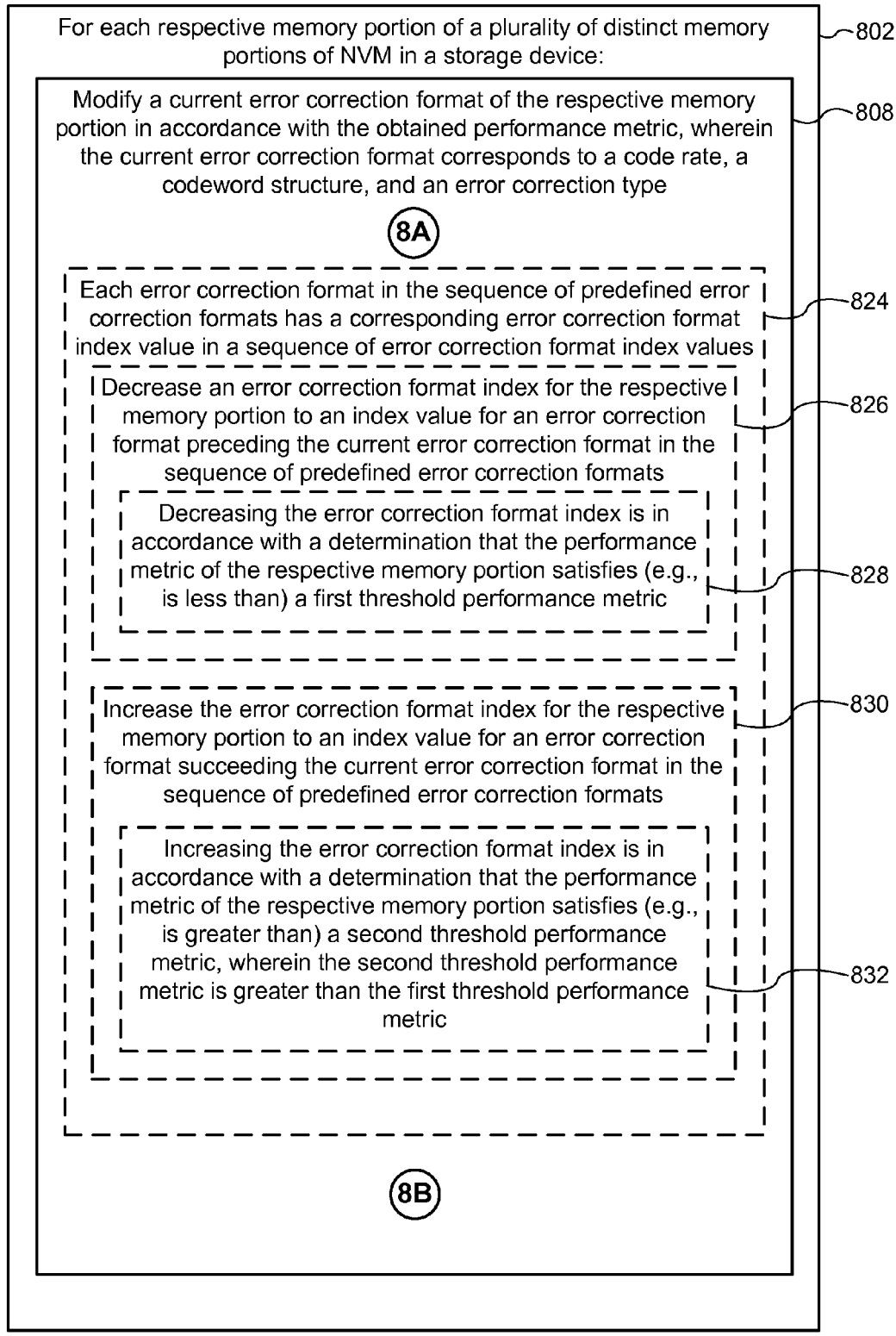
Figure 8C:
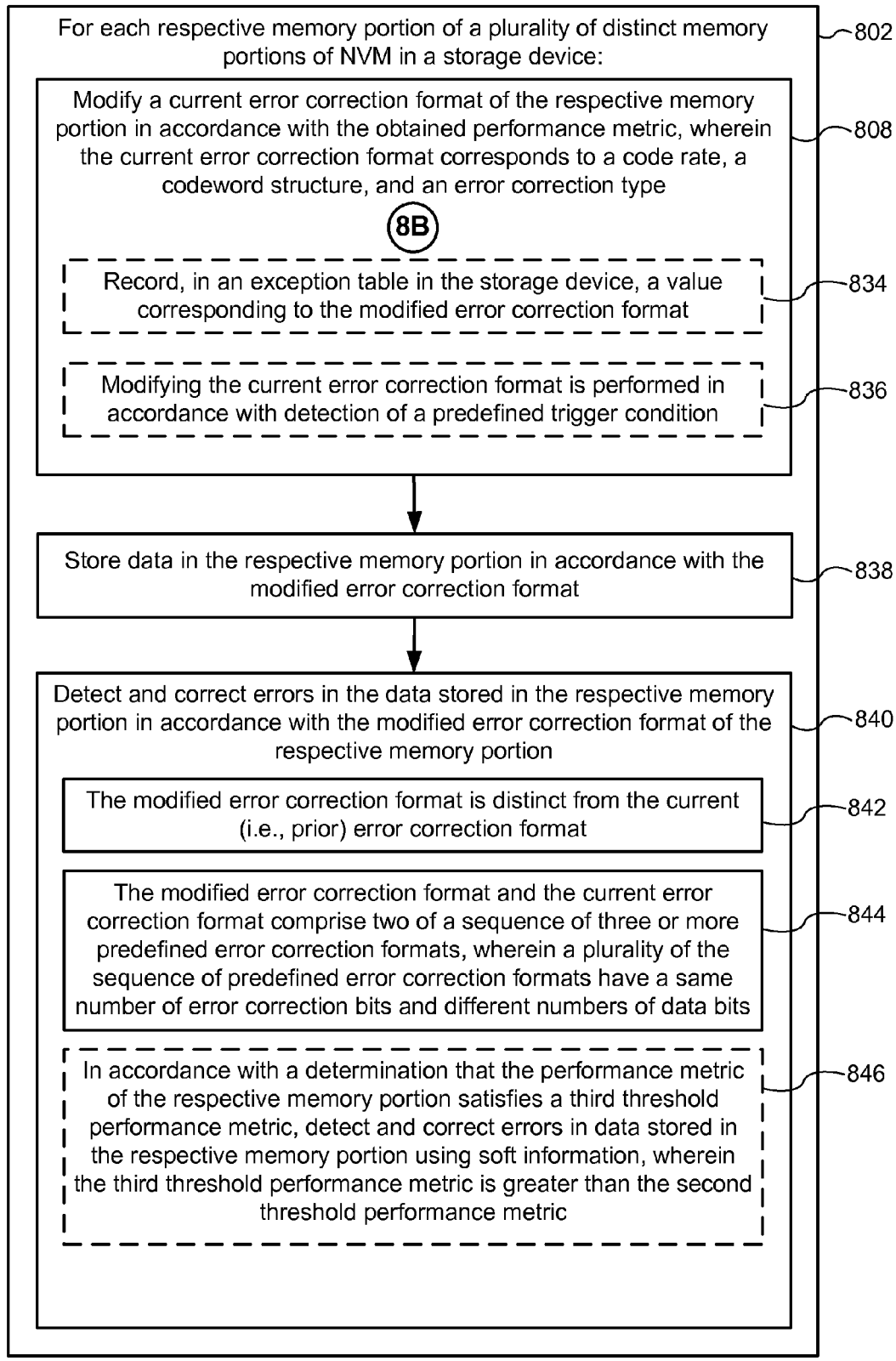

FIGS. 8A-8C illustrate a flowchart representation of a method 800 of modifying an error correction format of a respective memory portion of a non-volatile memory device, in accordance with some embodiments. Method 800 coordinates and manages multiple sub-system components of a storage device to modify an error correction format of a respective memory portion. At least in some implementations, one or more steps of method 800 are performed by a storage device (e.g., storage device 120, FIG. 1) or one or more components of the storage device (e.g., storage controller 124, management module 121, error control module 125, and/or NVM controllers 130, FIG. 1). In some embodiments, method 800 is governed by instructions that are stored in a non-transitory computer readable storage medium and that are executed by one or more processors of a device, such as the one or more processors 122 of management module 121 (FIG. 2) in storage controller 124, and/or the one or more processors of NVM controllers 130 (not shown).

For each respective memory portion of a plurality of distinct memory portions of non-volatile memory in a storage device (802), the storage device obtains (e.g., measures or reads from a known memory location or register) (806) a performance metric of the respective memory portion. In some embodiments, distinct memory portions are (804) distinct memory erase blocks, word lines or pages of the non-volatile memory device (e.g., erase blocks of NVM 140-1, FIG. 1).

The storage device modifies (808) a current error correction format of the respective memory portion in accordance with the obtained performance metric, wherein the current error correction format corresponds to a code rate (i.e., ratio of data bits in a codeword to the size of the codeword), a codeword structure (e.g., codeword length), and an error correction type (e.g., BCH, LDPC, etc.). In some embodiments, the performance metric is (810) a bit error rate (BER) (i.e., bit errors detected while decoding data read from a respective non-volatile memory device).

In some embodiments, modifying the current error correction format of the respective memory portion includes modifying at least one of the code rate and the error correction type corresponding to the current error correction format (812). For example, as shown in FIGS. 5A-5B, in accordance with a measured bit error rate of NVM device 140-1 (e.g., BER of 0.012 for NVM device 140-1, FIG. 5A), the code rate is modified (decreased) from 0.94 to 0.92 (as shown in FIG. 5B). In some embodiments, at least one of the codeword structure (e.g., codeword length) and the error correction type (e.g., BCH to LDPC) corresponding to the current error correction format is modified (814). In some embodiments, each predefined error correction format in a sequence of predefined error correction formats corresponds (816) to a distinct combination of code rate and error correction type. For example, referring to format descriptor 400 of FIG. 4A, each error correction format in the sequence of predefined error correction formats (e.g., error correction formats "1" through "8") corresponds to a distinct combination of code rate and error correction type.

In some embodiments, the current error correction format of the respective memory portion is (818) a base error correction format selected in accordance with physical characteristics of the respective memory portion. In some embodiments, the physical characteristics include (820) a physical location of the respective memory portion, wherein the physical location corresponds to either an upper page or a lower page of a multi-level cell. Other examples of physical characteristics (e.g., location of an associated word line, P/E cycle count, age metric of memory portion, semi-conductor process metric or performance metric, etc.) are discussed above with respect to FIG. 7B. Optionally, in some implementations, the current error correction format of the respective memory portion is modified (822) in accordance with a change in the physical characteristics of the respective memory portion. As an example, if the P/E cycle count for NVM device 140-1 (FIG. 1) exceeds a P/E cycle threshold of 500, the base error correction format is modified from a code rate of 0.95 to 0.94, so as to compensate (i.e., increase the error correction capability) for the increased likelihood of detected errors in data decoded from an increasingly worn memory portion of non-volatile memory.

Referring now to FIG. 8B, in some embodiments, each error correction format in the sequence of predefined error correction formats has (824) a corresponding error correction format index value in a sequence of error correction format index values (e.g., error correction formats "1" through "8," FIG. 4A). In some embodiments, modifying a current error correction format includes decreasing (826) an error correction format index for the respective memory portion to an index value for an error correction format preceding the current error correction format in the sequence of predefined error correction formats (e.g., decreasing from error correction format "3" to "2," as shown in table descriptor 400 of FIG. 4A, thereby decreasing the error correction capability of the error correction format used when storing data in the respective memory portion). In some embodiments, modifying a current error correction format includes increasing (830) the error correction format index for the respective memory portion to an index value for an error correction format succeeding the current error correction format in the sequence of predefined error correction formats (e.g., increasing from error correction format "2" to "3," as shown in table descriptor 400 of FIG. 4A, thereby increasing the error correction capability of the error correction format used when storing data in the respective memory portion). In some implementations, the error correction format index value for a respective memory portion is decreased and/or increased by more than a single index value (e.g., increasing from error correction format "2" to error correction format "4," or from error correction format "4" to error correction format "6").

In some embodiments, decreasing the error correction format index is (828) in accordance with a determination that the performance metric of the respective memory portion satisfies (e.g., is less than) a first threshold performance metric. Threshold performance metrics include hard decode engine limits (e.g., predefined threshold 504, 506, 508, FIG. 5A) and soft decode engine limits (e.g., predefined threshold 502). As an example, referring to the example of FIGS. 4 and 5A-5B, a first threshold performance metric is given as predefined threshold 508 (30% of the predefined hard decode limit). Because the measured bit error rate of NVM device 140-5 is less than predefined threshold 508 (e.g., as shown in FIG. 5A, NVM device 140-5 having a measured BER of approximately 0.003, which is less than the threshold of approximately 0.004), the error correction format index for NVM device 140-5 is therefore decreased from error correction format "4" (e.g., code rate 0.94, FIGS. 4A and 5A) to error correction format "3" (e.g., code rate 0.95, FIGS. 4A and 5B) so as to optimize data redundancy and system efficiency based on the measured BER.

Furthermore, in some embodiments, increasing the error correction format index is (832) in accordance with a determination that the performance metric of the respective memory portion satisfies (e.g., is greater than) a second threshold performance metric, wherein the second threshold performance metric is greater than the first threshold performance metric. For instance, referring to the example of FIGS. 4 and 5A-5B, a second threshold performance metric is given as predefined threshold 506 (70% of the predefined hard decode limit), which is greater than the first threshold performance metric (predefined threshold 508). Because the measured bit error rate of NVM device 140-2 is greater than predefined threshold 506 (e.g., as shown in FIG. 5A, NVM device 140-2 having a measured BER of approximately 0.011, which is greater than the threshold of approximately 0.010), the error correction format index for NVM device 140-2 is therefore increased from error correction format "4" (e.g., code rate 0.94, FIGS. 4A and 5A) to error correction format "6" (e.g., code rate 0.93, FIGS. 4A and 5B) so as to optimize data redundancy and system efficiency based on the measured BER.

Referring now to FIG. 8C, in some embodiments, a value corresponding to the modified error correction format is recorded (834) in an exception table in the storage device (e.g., exceptions table 230, FIG. 2).

In some embodiments, modifying the current error correction format is performed (836) in accordance with detection of a predefined trigger condition. For example, in some implementations, a performance metric of a memory portion is measured, and the current error correction format of the memory portion is modified, after a predefined number of P/E cycles (e.g., every 500 P/E cycles), or a predefined time has elapsed (e.g., after 2 years of continuous operation).

Data is stored (838) in the respective memory portion in accordance with the modified error correction format (i.e., codewords are produced and stored in a respective memory portion after its error correction format has been modified).

Furthermore, errors are detected and corrected (840) in the data stored in the respective memory portion in accordance with the modified error correction format of the respective memory portion, where the modified error correction format is distinct (842) from the current (i.e., prior) error correction format of the respective memory portion. That is, in reading data, codewords stored in a memory portion (e.g., NVM device 140-1, FIG. 1) are decoded, and errors detected in the decoded data are corrected, in accordance with a corresponding decoding algorithm (e.g., BCH) of a modified error correction format for the memory portion.

Furthermore, the modified error correction format and the current error correction format comprise (844) two of a sequence of three or more predefined error correction formats, wherein a plurality of the sequence of predefined error correction formats have a same number of error correction bits and different numbers of data bits. FIG. 3 illustrates example codewords (e.g., codewords 300-1 through 300-8), each of which is produced in accordance with a distinct error correction format in a sequence of predefined error correction formats. Specifically, in the example shown (not drawn to scale), codewords 300-1 through 300-3 are produced in accordance with respective error correction formats that have a same number of error correction bits and different numbers of data bits.

In some embodiments, in accordance with a determination that the performance metric of the respective memory portion satisfies (e.g., is greater than) a third threshold performance metric (e.g., soft decode limit, predefined threshold 502, FIG. 5A), errors in data stored in the respective memory portion are detected and corrected (846) using soft information, wherein the third threshold performance metric is greater than the second threshold performance metric (e.g., predefined threshold 506). Soft decoding using soft information is described in greater detail with respect to FIG. 1.

FIGS. 9A-9C illustrates a flowchart representation of a method 900 for reading data stored in a non-volatile memory in a data storage device, in accordance with some embodiments. Method 900 coordinates and manages multiple subsystem components of the storage device to read data stored in non-volatile memory of the storage device. At least in some implementations, one or more steps of method 900 are performed by a storage device (e.g., storage device 120, FIG. 1) or one or more components of the storage device (e.g., storage controller 124, management module 121, error control module 125, and/or NVM controllers 130, FIG. 1). In some embodiments, method 900 is governed by instructions that are stored in a non-transitory computer readable storage medium and that are executed by one or more processors of a device, such as the one or more processors 122 of management module 121 (FIG. 2) in storage controller 124, and/or the one or more processors of NVM controllers 130 (not shown).

A storage device (e.g., storage device 120, FIG. 1) has (902) a plurality of physical memory portions having a predefined sequence of physical locations in one or more non-volatile memory (NVM) devices of the storage device. An example is illustrated in FIG. 6, where physical pages 602-1 and 602-2, sharing word line 600-1, comprise physical memory portions having sequential physical locations in a non-volatile memory device (e.g., of NVM device 140-1, FIG. 1).

The storage device executes (906) a command for reading a requested logical group of data having a specified logical address. As described with respect to FIG. 1, a host system (e.g., computer system 110) sends one or more host read commands to storage controller 124 requesting a logical group of data from the storage device (e.g., NVM devices 140 of memory channels 150).

Executing the command for reading the requested logical group of data includes mapping (908) the logical address to one or more physical locations in the storage device (e.g., using translation tables 216 of FIG. 2, which include mapping information that identifies the physical locations in memory to which the logical groups of data are mapped).

In some embodiments, the storage device store a first logical group of data, in codewords that are mapped to (e.g., stored at) a single physical location (e.g., logic group 606-1, FIG. 6), a second logical group of data, in codewords that are mapped to two physical memory portions at sequential physical locations in the predefined sequence of physical locations (e.g., logic group 606-3, FIG. 6), and a third logical group of data, in codewords that are mapped to two physical memory portions at non-sequential physical locations in the predefined sequence of physical locations (e.g., logic group 606-6, FIG. 6).

In accordance with a first determination that the one or more physical locations in the storage device correspond to a single physical memory portion (910), the storage device reads (912) data from the single physical memory portion, which includes the requested logical group of data, and returns (918) the requested logical group of data. In some embodiments, reading data from the single physical memory portion includes (914) reading data from a plurality of codewords. In some implementations, or in some circumstances, the plurality of codewords is an integer number of codewords (e.g., codewords 604-1 through 604-4). As an example, referring to FIG. 6, user data for logical group 606-1 is mapped to codewords 604-1 and 604-2, which have physical locations corresponding to a single physical memory portion, namely physical page 602-1. In this example, a single read operation is used to read data (i.e., retrieve and decode codewords 604-1 and 604-2) from physical page 602-1. In some embodiments, the plurality of codewords includes (916) data for at least one logical group of data other than the requested logical group of data. For example, referring to the FIG. 6, codeword 604-2 includes data for both logical groups 606-1 and 606-2.

Referring to FIG. 9B, in accordance with a second determination that the one or more physical locations in the storage device correspond to two physical memory portions at sequential physical locations in the predefined sequence of physical locations (920), a single sequential read operation is used (922) to read data from the two physical memory portions, which together include the requested logical group of data. In some embodiments, the single sequential read operation to read data from the two physical memory portions reads (924) data from a single word line of a respective non-volatile memory device of the storage device. For example, referring to FIG. 6, user data for logical group 606-3 is mapped to codewords 604-4 and 604-5, which have physical locations corresponding to two physical memory portions at sequential physical locations (e.g., adjacent physical pages 602-1 and 602-2 on word line 600-1). In this example, a single sequential read operation is used to read data from physical pages 602-1 and 602-2 on word line 600-1. In some implementations, performing a sequential read operation includes reading data from all physical memory portions associated with a word line (e.g., all codewords of physical pages 602-1 and 602-2, FIG. 6). In other embodiments, data is read from only a subset of all physical memory portions associated with a word line.

In some embodiments, the sequential read operation reads (926) data from a plurality of physical memory portions, wherein the plurality of physical memory portions store (i.e., contain or include the data for) a plurality of logical groups of data. In some implementations, the plurality of logical groups of data comprises an integer number of logical groups of data. Alternatively, in some embodiments or in some circumstances, the plurality of physical memory portions read by the sequential read operation (926) contain data from a plurality of logical groups of data, but include less than all the data from at least one of those logical groups of data.

In some embodiments, reading data from the two physical memory portions (step 922) includes reading (928) data from a first plurality of codewords stored in one of the two physical memory portions, and reading (930) data from a second plurality of codewords stored in the other of the two physical memory portions, wherein each codeword of the first plurality of codewords have (932) a first codeword length, and each codeword of the second plurality of codewords have a second codeword length, distinct from the first codeword length. As a non-limiting example, referring to FIG. 6, reading requested logical group 606-3 includes reading data from codewords 604-1 through 604-4 in physical page 602-1, and reading data from codewords 604-5 through 604-7 in physical page 602-2, where codewords 604-1 through 604-4 have a smaller codeword length than codewords 604-5 through 604-7 (as illustrated). As discussed throughout, in some embodiments, different physical memory portions include codewords having different codeword lengths as a result of encoding user data in accordance with distinct error correction formats for respective physical memory portions. Continuing the example of FIG. 6, a respective error correction format for physical page 602-1 is defined as having a codeword structure (i.e., codeword length) that is smaller than the codeword structure defining the corresponding error correction format for physical page 602-2.

In accordance with a third determination that the one or more physical locations in the storage device correspond to two physical memory portions at non-sequential physical locations in the predefined sequence of physical locations (936), the storage device uses (938) two read operations to read data from the two non-sequential physical memory portions, which together include the requested logical group of data, and returns (942) the requested logical group of data. In some embodiments, the two read operations to read data from the two non-sequential physical memory portions read (940) data from two distinct word lines in one or two non-volatile memory devices of the storage device. For example, referring to FIG. 6, user data for logical group 606-6 is mapped to codewords 604-7 and 604-8, which have physical locations corresponding to two physical memory portions at non-sequential physical locations (e.g., physical pages 602-2 and 602-3 on word lines 600-1 and 600-2, respectively). Consequently, in this example, two read operations are used to read data from physical pages 602-2 and 602-3.

Another embodiment includes a method for storing data stored in a non-volatile memory device. At least in some implementations, one or more steps of the method described below are performed by a storage device (e.g., storage device 120, FIG. 1) or one or more components of the storage device (e.g., storage controller 124, management module 121, error control module 125, and/or NVM controllers 130, FIG. 1). In some embodiments, the method is governed by instructions that are stored in a non-transitory computer readable storage medium and that are executed by one or more processors of a device, such as the one or more processors 122 of management module 121 (FIG. 2) in storage controller 124, and/or the one or more processors of NVM controllers 130 (not shown).

A non-volatile storage device (e.g., storage device 120, FIG. 1) has a plurality of physical memory portions having a predefined sequence of physical locations in one or more non-volatile memory devices of the storage device.

In these embodiments, the storage device executes a plurality of commands, each command of the plurality of commands for storing in the storage device a requested logical group of data having a specified logical address.

For each command of the plurality of commands, the storage device stores the data in one or more physical locations in the storage device. In some embodiments, storing the data in the one or more physical locations in the storage device includes encoding the data to produce one or more codewords, and storing the one or more codewords in the one or more physical locations in the storage device (as described with respect to FIG. 1).

Furthermore, for each command of the plurality of commands, the storage device maps the logical address of the logical group of data to the one or more physical locations in the storage device.

For a first command of the plurality of commands, the one or more physical locations in the storage device correspond to a single physical memory portion in the storage device.

For a second command of the plurality of commands, the one or more physical locations in the storage device correspond to two physical memory portions at sequential physical locations in the predefined sequence of physical locations. In some embodiments, the two physical memory portions at sequential physical locations in the predefined sequence of physical locations are physical memory portions of a single word line of a respective non-volatile memory device of the storage device (e.g., adjacent physical pages 602-1 and 602-2 sharing word line 600-1, FIG. 6). Viewed another way, as described above with respect to method 900 above, according to some implementations, sequential physical locations are physical locations that can be read using a single sequential read operation.

For a third command of the plurality of commands, the one or more physical locations in the storage device comprise two physical memory portions at non-sequential physical locations in the predefined sequence of physical locations. In some embodiments, the two physical memory portions at non-sequential physical locations in the predefined sequence of physical locations are physical memory portions of two distinct word lines in one or two non-volatile memory devices of the storage device (e.g., physical pages 602-2 and 602-3 located on different word lines 600-1 and 600-2, respectively, FIG. 6). Viewed another way, as described above with respect to method 900 above, according to some implementations, non-sequential physical locations are physical locations that can only be read using separate read operations.

In some embodiments, for the first command, the one or more physical locations meet first criteria. In some implementations, the first physical location of the one or more physical locations meets first criteria when the one or more physical locations correspond to one or more physical locations in the single physical memory portion that are available for writing. In some embodiments, for the second command, the one or more physical locations meet second criteria distinct from the first criteria. In some implementations, the one or more physical locations meet second criteria when the one or more physical locations correspond to two physical memory portions having sequential physical locations that are available for writing. Furthermore, in some embodiments, for the third command, the one or more physical locations meets third criteria distinct from the first criteria and second criteria. In some implementations, the one or more physical locations meet third criteria when the one or more physical locations correspond to two physical memory portions having non-sequential physical locations that are available for writing. In some embodiments, the third criteria is met when the first and second criteria are not met.

It should be understood that the particular order in which the operations in FIGS. 7A-7C, 8A-8C, and 9A-9C have been described is merely exemplary and is not intended to indicate that the described order is the only order in which the operations could be performed. One of ordinary skill in the art would recognize various ways to reorder the operations described herein.

In some implementations, with respect to any of the methods described above, the non-volatile memory is a single non-volatile memory device (e.g., flash memory device), while in other implementations, the non-volatile memory includes a plurality of non-volatile memory devices (e.g., flash memory devices).

In some implementations, with respect to any of the methods described above, a storage device includes (1) an interface for coupling the storage device to a host system, (2) a plurality of controllers, each of the plurality of controllers configured to transfer data held in volatile memory to non-volatile memory, and (3) a data hardening module including one or more processors and an energy storage device, the storage device configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact"

are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method for modifying an error correction format of a respective memory portion of non-volatile memory (NVM) in a storage device, the NVM of the storage device having a plurality of distinct memory portions, the method comprising:
   for each respective memory portion of a plurality of distinct memory portions of the NVM:
      obtaining a performance metric of the respective memory portion;
      modifying a current error correction format of the respective memory portion in accordance with the obtained performance metric, wherein the current error correction format corresponds to a code rate, a codeword structure, and an error correction type;
      storing data in the respective memory portion in accordance with the modified error correction format; and
      detecting and correcting errors in the data stored in the respective memory portion in accordance with the modified error correction format of the respective memory portion, wherein
         the modified error correction format is distinct from the current error correction format, and
         the modified error correction format and the current error correction format comprise two of a sequence of three or more predefined error correction formats, wherein a plurality of the sequence of predefined error correction formats have a same number of error correction bits and different numbers of data bits.

2. The method of claim 1, wherein modifying the current error correction format of the respective memory portion includes modifying at least one of the code rate and the error correction type corresponding to the current error correction format.

3. The method of claim 1, wherein modifying the current error correction format of the respective memory portion includes modifying at least one of the codeword structure and the error correction type corresponding to the current error correction format.

4. The method of claim 1,
   wherein each predefined error correction format in the sequence of predefined error correction formats corresponds to a distinct combination of code rate and error correction type.

5. The method of claim 4, wherein each error correction format in the sequence of predefined error correction formats has a corresponding error correction format index value in a sequence of error correction format index values, and modifying the current error correction format of the respective memory portion includes:
   decreasing an error correction format index for the respective memory portion to an index value for an error correction format preceding the current error correction format in the sequence of predefined error correction formats; or
   increasing the error correction format index for the respective memory portion to an index value for an error correction format succeeding the current error correction format in the sequence of predefined error correction formats.

6. The method of claim 5, wherein:
   decreasing the error correction format index is in accordance with a determination that the performance metric of the respective memory portion satisfies a first threshold performance metric, and
   increasing the error correction format index is in accordance with a determination that the performance metric of the respective memory portion satisfies a second threshold performance metric, wherein the second threshold performance metric is greater than the first threshold performance metric.

7. The method of claim 6, further comprising, in accordance with a determination that the performance metric of the respective memory portion satisfies a third threshold performance metric, detecting and correcting errors in data stored in the respective memory portion using soft information, wherein the third threshold performance metric is greater than the second threshold performance metric.

8. The method of claim 1, wherein the current error correction format of the respective memory portion is a base error correction format selected in accordance with physical characteristics of the respective memory portion.

9. The method of claim 8, wherein:
   the physical characteristics include a physical location of the respective memory portion, wherein the physical location corresponds to either an upper page or a lower page of a multi-level cell.

10. The method of claim 1, further comprising modifying the current error correction format of the respective memory portion in accordance with a change in the physical characteristics of the respective memory portion.

11. The method of claim 1, wherein modifying the current error correction format of the respective memory portion includes recording, in an exception table in the storage device, a value corresponding to the modified error correction format.

12. The method of claim 1, wherein modifying the current error correction format is performed in accordance with detection of a predefined trigger condition.

13. The method of claim 1, wherein the distinct memory portions are distinct memory erase blocks, word lines or pages of the NVM device.

14. The method of claim 1, wherein the performance metric is a bit error rate (BER).

15. A storage system, comprising:
non-volatile memory (NVM) having a plurality of distinct memory portions in a plurality of non-volatile memory devices; and
one or more memory controllers, the one or more memory controllers including one or more processors and memory for storing one or more programs for execution by the one or more processors, the one or more programs including instructions for performing operations comprising:
for each respective memory portion of a plurality of distinct memory portions of the NVM:
obtaining a performance metric of the respective memory portion;
modifying a current error correction format of the respective memory portion in accordance with the obtained performance metric, wherein the current error correction format corresponds to a code rate, a codeword structure, and an error correction type;
storing data in the respective memory portion in accordance with the modified error correction format; and
detecting and correcting errors in the data stored in the respective memory portion in accordance with the modified error correction format of the respective memory portion, wherein
the modified error correction format is distinct from the current error correction format, and
the modified error correction format and the current error correction format comprise two of a sequence of three or more predefined error correction formats, wherein a plurality of the sequence of predefined error correction formats have a same number of error correction bits and different numbers of data bits.

16. The storage system of claim 15, including a performance metric module configured to obtaining a performance metric for a respective memory portion, and an ECC adjustment module configured to modify the error correction format of the respective memory portion in accordance with the obtained performance metric, and record, in a table in the storage system, an error correction format index value corresponding to the modified error correction format.

17. The storage system of claim 15, including a performance metric module configured to obtaining a performance metric for a respective memory portion, an ECC adjustment module configured to modify the error correction format of the respective memory portion in accordance with the obtained performance metric, and a memory operation module configured to store data in the respective memory portion, and to detect and correct errors in the data stored in the respective memory portion.

18. The storage system of claim 15, wherein modifying the current error correction format of the respective memory portion includes modifying at least one of the code rate and the error correction type corresponding to the current error correction format.

19. The storage system of claim 15, wherein modifying the current error correction format of the respective memory portion includes modifying at least one of the codeword structure and the error correction type corresponding to the current error correction format.

20. The storage system of claim 15, wherein each predefined error correction format in the sequence of predefined error correction formats corresponds to a distinct combination of code rate and error correction type.

21. The storage system of claim 20, wherein each error correction format in the sequence of predefined error correction formats has a corresponding error correction format index value in a sequence of error correction format index values, and modifying the current error correction format of the respective memory portion includes:
decreasing an error correction format index for the respective memory portion to an index value for an error correction format preceding the current error correction format in the sequence of predefined error correction formats; or
increasing the error correction format index for the respective memory portion to an index value for an error correction format succeeding the current error correction format in the sequence of predefined error correction formats.

22. The storage system of claim 21, wherein:
decreasing the error correction format index is in accordance with a determination that the performance metric of the respective memory portion satisfies a first threshold performance metric, and
increasing the error correction format index is in accordance with a determination that the performance metric of the respective memory portion satisfies a second threshold performance metric, wherein the second threshold performance metric is greater than the first threshold performance metric.

23. The storage system of claim 22, wherein the one or more programs further include instructions for performing operations comprising, in accordance with a determination that the performance metric of the respective memory portion satisfies a third threshold performance metric, detecting and correcting errors in data stored in the respective memory portion using soft information, wherein the third threshold performance metric is greater than the second threshold performance metric.

24. The storage system of claim 15, wherein the current error correction format of the respective memory portion is a base error correction format selected in accordance with physical characteristics of the respective memory portion.

25. The storage system of claim 24, wherein:
the physical characteristics include a physical location of the respective memory portion, wherein the physical location corresponds to either an upper page or a lower page of a multi-level cell.

26. The storage system of claim 15, further comprising modifying the current error correction format of the respective memory portion in accordance with a change in the physical characteristics of the respective memory portion.

27. The storage system of claim 15, wherein modifying the current error correction format of the respective memory portion includes recording, in an exception table in the storage device, a value corresponding to the modified error correction format.

28. A non-transitory computer readable storage medium, storing one or more programs for execution by one or more processors, the one or more programs including instructions for performing operations comprising:
- for each respective memory portion of a plurality of distinct memory portions of the NVM:
  - obtaining a performance metric of the respective memory portion;
  - modifying a current error correction format of the respective memory portion in accordance with the obtained performance metric, wherein the current error correction format corresponds to a code rate, a codeword structure, and an error correction type;
  - storing data in the respective memory portion in accordance with the modified error correction format; and
  - detecting and correcting errors in the data stored in the respective memory portion in accordance with the modified error correction format of the respective memory portion, wherein
    - the modified error correction format is distinct from the current error correction format, and
    - the modified error correction format and the current error correction format comprise two of a sequence of three or more predefined error correction formats, wherein a plurality of the sequence of predefined error correction formats have a same number of error correction bits and different numbers of data bits.

* * * * *